(12) United States Patent
Shimazawa et al.

(10) Patent No.: US 7,525,773 B2
(45) Date of Patent: Apr. 28, 2009

(54) THIN FILM MAGNETIC HEAD, HEAD GIMBAL ASSEMBLY, AND HARD DISK DRIVE HAVING A DUAL SPIN-VALVE MAGNETO-RESISTIVE ELEMENT

(75) Inventors: Koji Shimazawa, Tokyo (JP); Yoshihiro Tsuchiya, Tokyo (JP)

(73) Assignee: TDK Corporation, Tokyo (JP)

( * ) Notice: Subject to any disclaimer, the term of this patent is extended or adjusted under 35 U.S.C. 154(b) by 508 days.

(21) Appl. No.: 11/105,554

(22) Filed: Apr. 14, 2005

(65) Prior Publication Data
US 2005/0237674 A1 Oct. 27, 2005

(30) Foreign Application Priority Data
Apr. 21, 2004 (JP) .............................. 2004-125556

(51) Int. Cl.
*G11B 5/33* (2006.01)
(52) U.S. Cl. ................................. 360/324.11
(58) Field of Classification Search ........................ None
See application file for complete search history.

(56) References Cited

U.S. PATENT DOCUMENTS

| | | | |
|---|---|---|---|
| 5,701,222 A | 12/1997 | Gill et al. ..................... 360/314 |
| 6,055,136 A | 4/2000 | Gill et al. ..................... 360/314 |
| 6,122,150 A | 9/2000 | Gill ........................ 360/324.11 |
| 6,338,899 B1 | 1/2002 | Fukuzawa et al. ....... 360/324.12 |
| 6,612,018 B1 | 9/2003 | Gill ........................... 29/603.14 |
| 2002/0048690 A1 | 4/2002 | Fukuzawa et al. ........... 428/811 |
| 2003/0143431 A1* | 7/2003 | Hasegawa .................... 428/692 |
| 2004/0121185 A1 | 6/2004 | Fukuzawa et al. ............ 428/815 |
| 2004/0264066 A1 | 12/2004 | Shimizu et al. .............. 701/209 |
| 2005/0018367 A1 | 1/2005 | Terunuma et al. ........ 360/324.12 |
| 2005/0024793 A1* | 2/2005 | Nakabayashi et al. .. 360/324.11 |
| 2006/0012924 A1* | 1/2006 | Takano ..................... 360/324.1 |
| 2007/0220740 A1* | 9/2007 | Horng et al. .............. 29/603.07 |
| 2007/0252588 A1* | 11/2007 | Nishiyama ............. 324/207.21 |

FOREIGN PATENT DOCUMENTS

| | | |
|---|---|---|
| JP | 9-147326 | 6/1997 |
| JP | 2000-113418 | 4/2000 |
| JP | 2000-137906 | 5/2000 |
| JP | 2000-149229 | 5/2000 |
| JP | 2000-276714 | 10/2000 |
| JP | 2002-185060 | 6/2002 |

* cited by examiner

*Primary Examiner*—David D Davis
(74) *Attorney, Agent, or Firm*—Oblon, Spivak, McClelland, Maier & Neustadt, P.C.

(57) ABSTRACT

A thin film magnetic head includes a dual spin-valve magneto-resistive element. The dual spin-valve magneto-resistive element has a dual spin-valve magneto-resistive effect multilayer film composed of a first antiferromagnetic layer, a first fixed magnetic layer being a synthetic ferrimagnetic fixed layer, a first nonmagnetic layer, a soft magnetic layer, a second nonmagnetic layer, and a second fixed magnetic layer being a synthetic ferrimagnetic fixed layer. A stacked film thickness relationship of the first fixed magnetic layer, a stacked film thickness relationship of the second fixed magnetic layer, and a magnetostrictive constant are determined, and it is configured such that a static magnetic field produced from the first fixed magnetic layer and a current magnetic field generated by a sense current act to assist magnetization of the second fixed magnetic layer. Therefore, it is possible to obtain a thin film magnetic head of which the reproduction output is large while gap narrowing and track narrowing are achieved and of which the reliability is high with enhanced stability in pinning fixation.

20 Claims, 18 Drawing Sheets

FIG.19A
FIG.19B
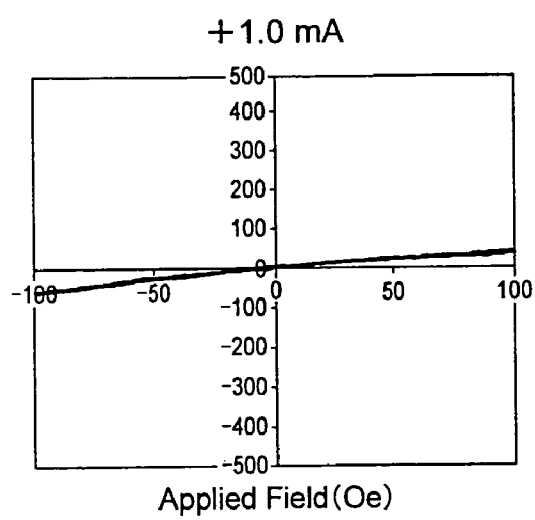
+1.0 mA
Applied Field (Oe)
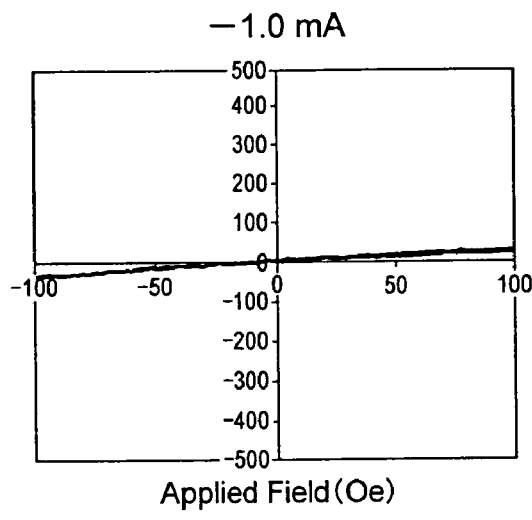
−1.0 mA
Applied Field (Oe)

FIG.20A
FIG.20B
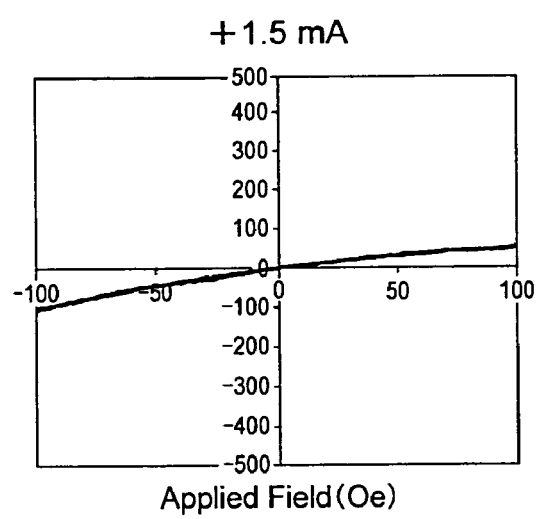
+1.5 mA
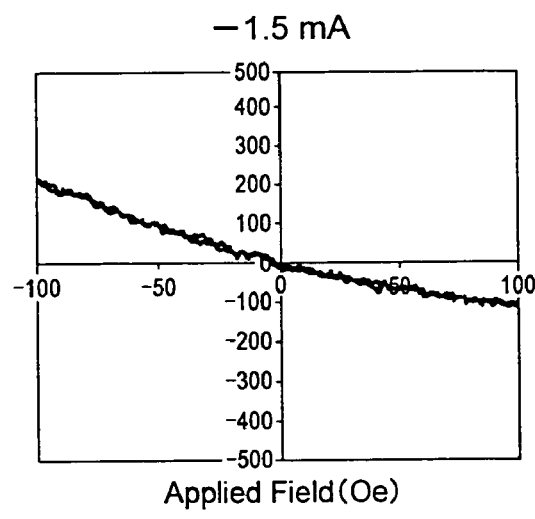
−1.5 mA

FIG. 22A
FIG. 22B
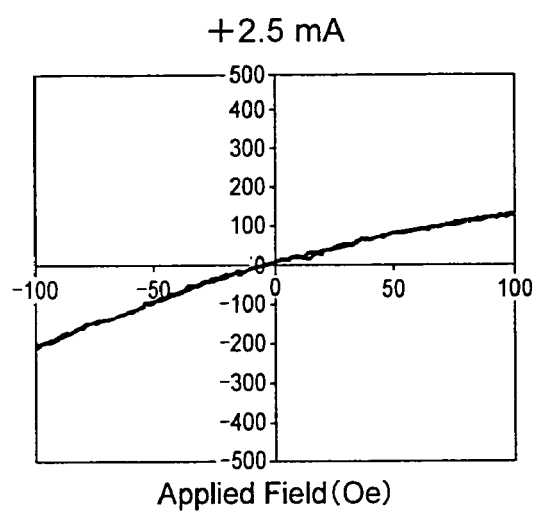
+2.5 mA
Applied Field (Oe)
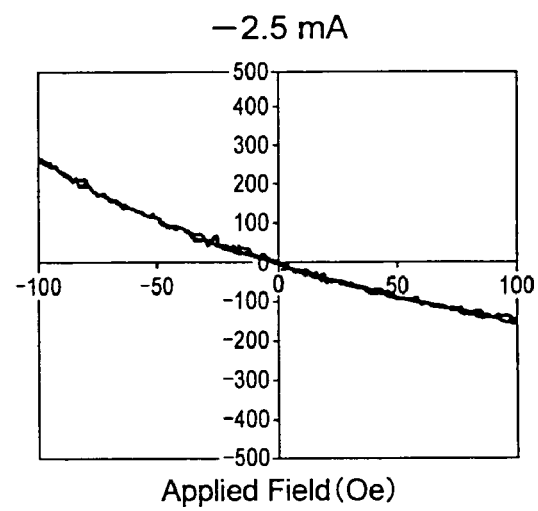
−2.5 mA
Applied Field (Oe)

+3.0 mA

Applied Field (Oe)

−3.0 mA

Applied Field (Oe)

THIN FILM MAGNETIC HEAD, HEAD GIMBAL ASSEMBLY, AND HARD DISK DRIVE HAVING A DUAL SPIN-VALVE MAGNETO-RESISTIVE ELEMENT

BACKGROUND OF THE INVENTION

1. Field of the Invention

The present invention relates to a thin film magnetic head having a dual spin-valve magneto-resistive element for reading as a signal a magnetic field strength of a magnetic recording medium or the like, and further relates to a head gimbal assembly and a hard disk drive each including such a thin film magnetic head.

2. Description of the Related Art

In recent years, following the improvement in areal recording density of a hard disk drive, improvement in performance of a thin film magnetic head has been required. As the thin film magnetic head, use has been widely made of a composite thin film magnetic head having a structure wherein a reproducing head comprising a read-only magneto-resistive effect element (hereinafter may also be referred to simply as an "MR element"), and a recording head comprising a write-only induction-type electromagnetic transducer element are stacked relative to a substrate.

As the MR element, there can be cited an AMR element using an anisotropic magneto-resistive effect, a GMR element using a giant magneto-resistive effect, a TMR element using a tunnel-type magneto-resistive effect, or the like.

As the GMR element, a spin-valve GMR element has often been used. The spin-valve GMR element comprises a nonmagnetic layer, a soft magnetic layer formed on one surface of the nonmagnetic layer, a ferromagnetic layer formed on the other surface of the nonmagnetic layer, and a pinning layer (generally an antiferromagnetic layer) formed on the ferromagnetic layer on its side apart from the nonmagnetic layer. The soft magnetic layer is a layer that acts to change its magnetization direction depending on a signal magnetic field from the exterior. The ferromagnetic layer is a layer of which a magnetization direction is fixed, i.e. which is subjected to exchange coupling by a magnetic field from the pinning layer (antiferromagnetic layer) so that the magnetization direction thereof is controlled in one direction (pinned direction).

Such an exchange coupling force and thermal stability of the exchange coupling force largely affect characteristics and reliability of the head and therefore it is required to produce as large an exchange coupling force as possible. It has been proposed that a ferromagnetic layer contacting with an antiferromagnetic layer is formed into a three-layer structure of ferromagnetic layer/nonmagnetic metal layer/ferromagnetic layer, different from a conventional single-layer structure, so as to induce strong exchange coupling between the two ferromagnetic layers (synthetic ferrimagnetic structure), thereby effectively increasing the exchange coupling from the antiferromagnetic layer (JP-A-2000-137906, JP-A-2000-113418).

Further, in terms of improving the output, a proposal has been made for a dual spin-valve structure wherein two conventional spin-valve sensors are stacked together (JP-A-H09-147326, JP-A-2002-185060). Specifically, since two nonmagnetic layers of Cu or the like exist in the dual spin-valve structure, the number of interfaces for improving the GMR change rate increases to four and more sense current can flow in total. Further, an element height (MR height) corresponding to an inward depth from an ABS (Air Bearing Surface) can be reduced as compared with that of a single spin-valve structure.

However, in the dual spin-valve structure, antiferromagnetic layers for fixing a magnetization direction need to be formed on a lower-layer side and an upper-layer side, respectively, i.e. two antiferromagnetic layers in total need to be formed. As a result of assiduous studies by the present inventors about film structures of these antiferromagnetic layers, it has been found as one of hints to reach the present invention that the antiferromagnetic layer near an underlayer can be formed as an excellent film with high reliability under the influence of the underlayer, while the other antiferromagnetic layer located on the upper-layer side tends to be a film with low reliability of which the heat resistance and impact resistance are insufficient as different from the film quality of the antiferromagnetic layer located below.

Consequently, there is a tendency that the pinning effect achieved by the antiferromagnetic layer located on the upper-layer side includes many unstable factors, thus resulting in insufficient reliability in pinning direction.

In addition to such a reason, in order to further reduce the thickness of a dual spin-valve structure film, a proposal has been made for a technique of producing a pinning effect for a ferromagnetic layer on one side without employing a corresponding antiferromagnetic layer, i.e. by the use of another method (JP-A-2000-276714, JP-A-2000-149229). More specifically, there has been proposed a spin-valve magnetic sensor that exhibits a pinning bias characteristic according to magnetostatic coupling at end portions of magnetic films and a current bias magnetic field generated by a sense current, i.e. without a pinning function achieved by the antiferromagnetic film or the like. However, in the proposed technique, the pinning operation of fixing a magnetization direction of the ferromagnetic layer using only the magnetic field generated by the sense current lacks stability in pinning fixation in terms of the current state of the art, and therefore, it can be said that commercialization is not practical. It is also suggested to dispose an antiferromagnetic layer on only one side of a dual spin-valve structure film and utilize a static magnetic field leaking from a ferromagnetic layer exchange-coupled to the antiferromagnetic layer.

However, the present situation is that there is no indication of a specific structure for realizing a product of which the reproduction output is large while further gap narrowing and track narrowing are achieved and of which the reliability is high with enhanced stability in pinning fixation.

The present invention has been conceived under these circumstances and has an object to provide a thin film magnetic head of which the reproduction output is large while further gap narrowing and track narrowing are achieved and of which the reliability is high with enhanced stability in pinning fixation, and has a further object to provide a head gimbal assembly and a hard disk drive each comprising such an improved thin film magnetic head.

Particularly, with respect to the stability in pinning fixation, it is an object of the present invention to provide a thin film magnetic head having properties such that even when (1) there is HDI (Hard Disk Interface) damage due to contact between the thin film magnetic head and a recording medium, or the like during operation of the thin film magnetic head, (2) there is processing stress caused by cutting a wafer into bars each including many thin film magnetic heads and further cutting each bar into the individual magnetic heads, or the like, a pinned direction of a pinned magnetic layer can be maintained in a proper direction without being reversed so that the stability and reliability of the operation are ensured, i.e. the rate of pinning reversal failure, where the polarity is reversed during the operation, is small and the rate of pinned direction failure, where the pinned direction does not coincide with a required direction after polishing, is small.

SUMMARY OF THE INVENTION

For accomplishing the foregoing objects, according to one aspect of the present invention, there is obtained a thin film magnetic head comprising a dual spin-valve magneto-resistive element, wherein the dual spin-valve magneto-resistive element comprises a dual spin-valve magneto-resistive effect multilayer film comprising a first antiferromagnetic layer, a first fixed magnetic layer, a first nonmagnetic layer, a soft magnetic layer, a second nonmagnetic layer, and a second fixed magnetic layer, wherein the first fixed magnetic layer is formed as a synthetic ferrimagnetic fixed layer comprising a first magnetic layer contacting with the first antiferromagnetic layer and having a magnetization direction fixed by an exchange coupling magnetic field of the first antiferromagnetic layer, and a second magnetic layer stacked relative to the first magnetic layer via a nonmagnetic intermediate layer, wherein the second fixed magnetic layer is formed as a synthetic ferrimagnetic fixed layer comprising a third magnetic layer located on the side of the second nonmagnetic layer, and a fourth magnetic layer stacked relative to the third magnetic layer via a nonmagnetic intermediate layer, wherein a static magnetic field produced from end portions of the first fixed magnetic layer acts to assist and fix magnetization of the second fixed magnetic layer, and a sense current applied to the dual spin-valve magneto-resistive effect multilayer film has a current value of 1.5 to 5.0 mA and generates a current magnetic field that acts to assist and fix the magnetization of the second fixed magnetic layer, wherein, given that thicknesses of the first magnetic layer and the second magnetic layer forming the first fixed magnetic layer are t1 and t2, respectively, and thicknesses of the third magnetic layer and the fourth magnetic layer forming the second fixed magnetic layer are t3 and t4, respectively, a relationship is established such that when t1>t2, t3>t4, while, when t2>t1, t4>t3, wherein a value of |t1−t2| representing an absolute value of a difference in film thickness between t1 and t2 is set to 2 to 6 Å, and a value of |t3−t4| representing an absolute value of a difference in film thickness between t3 and t4 is set to 2 to 6 Å, and wherein the third magnetic layer and the fourth magnetic layer forming the second fixed magnetic layer each have a physical property that an absolute value of a magnetostrictive constant thereof is $5 \times 10^{-6}$ or less.

As a preferred mode of the present invention, it is configured such that each of t1, t2, t3, and t4 is set in the range of 5 to 30 Å.

As a preferred mode of the present invention, it is configured such that each of t1, t2, t3, and t4 is set in the range of 10 to 18 Å.

As a preferred mode of the present invention, it is configured such that the first magnetic layer and the second magnetic layer forming the first fixed magnetic layer and the third magnetic layer and the fourth magnetic layer forming the second fixed magnetic layer are made of the same material.

As a preferred mode of the present invention, it is configured such that the first magnetic layer and the second magnetic layer forming the first fixed magnetic layer and the third magnetic layer and the fourth magnetic layer forming the second fixed magnetic layer are made of CoFe.

As a preferred mode of the present invention, it is configured such that the first antiferromagnetic layer is made of IrMn.

As a preferred mode of the present invention, it is configured such that the thickness of the dual spin-valve magneto-resistive effect multilayer film is set in the range of 150 to 350 Å.

As a preferred mode of the present invention, it is configured such that the value of the sense current applied to the dual spin-valve magneto-resistive effect multilayer film is set in the range of 2.0 to 4.0 mA.

As a preferred mode of the present invention, it is configured such that the dual spin-valve magneto-resistive effect multilayer film comprises the first antiferromagnetic layer, the first fixed magnetic layer, the first nonmagnetic layer, the soft magnetic layer, the second nonmagnetic layer, and the second fixed magnetic layer in the order named from the side of an underlayer.

According to another aspect of the present invention, there is obtained a head gimbal assembly comprising a slider including the foregoing thin film magnetic head and disposed so as to confront a recording medium, and a suspension elastically supporting the slider.

According to another aspect of the present invention, there is obtained a hard disk drive comprising a slider including the foregoing thin film magnetic head and disposed so as to confront a disc-shaped recording medium driven to be rotated, and a positioning device supporting the slider and positioning the slider relative to the recording medium.

BRIEF DESCRIPTION OF THE DRAWINGS

FIGS. 19(A) and (B) are graphs respectively showing relationships of an output voltage (axis of ordinates in each graph) with respect to an external magnetic field (axis of abscissas in each graph) when a sense current of +1.0 mA and a sense current of −1.0 mA were applied, respectively;

FIGS. 20(A) and (B) are graphs respectively showing relationships of an output voltage (axis of ordinates in each graph) with respect to an external magnetic field (axis of abscissas in each graph) when a sense current of +1.5 mA and a sense current of −1.5 mA were applied, respectively;

FIGS. 22(A) and (B) are graphs respectively showing relationships of an output voltage (axis of ordinates in each graph) with respect to an external magnetic field (axis of abscissas in each graph) when a sense current of +2.5 mA and a sense current of −2.5 mA were applied, respectively.

DETAILED DESCRIPTION OF THE INVENTION

Now, specific embodiments of the present invention will be described in detail hereinbelow with reference to the drawings.

The present invention relates to a thin film magnetic head having a dual spin-valve magneto-resistive element and the gist thereof resides in a structure of a dual spin-valve magneto-resistive multilayer film forming the magneto-resistive element incorporated in a reproducing head.

Figure 1:
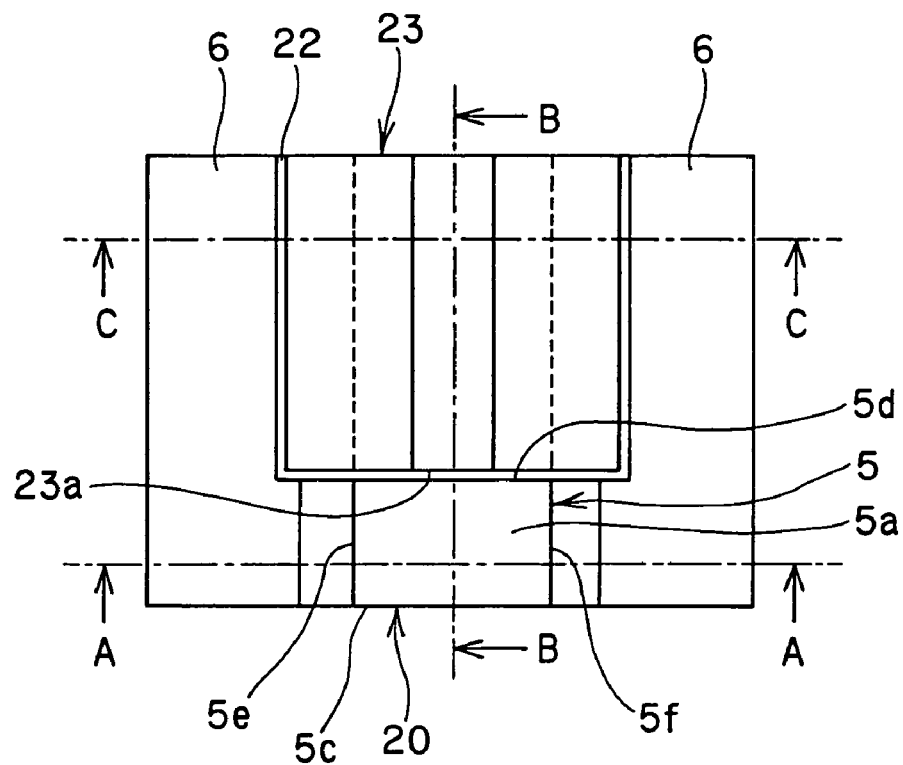
FIG. 1 is a plan view showing the main part of a reproducing head in an embodiment of the present invention.
Figure 2:
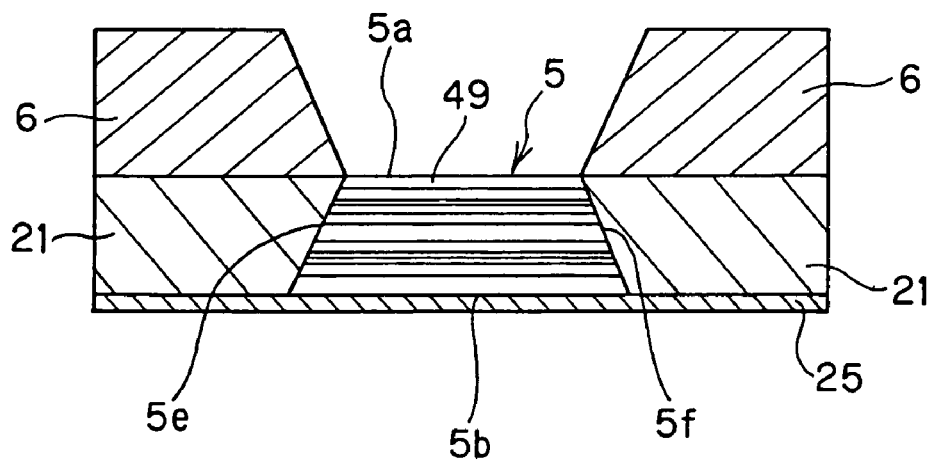
FIG. 2 is a sectional view taken along line A-A in FIG. 1.
Figure 3:
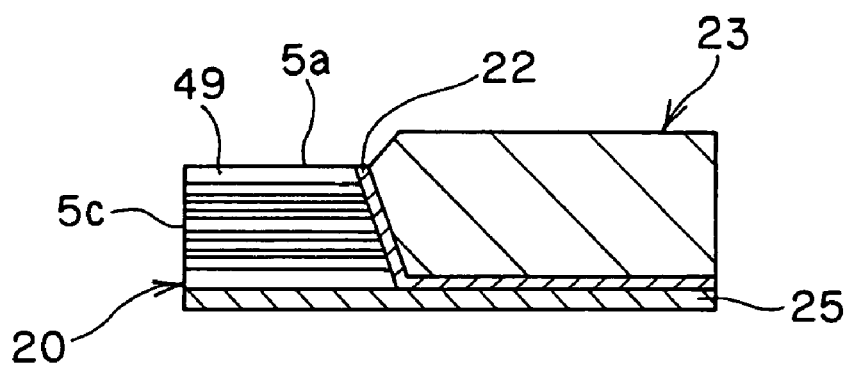
FIG. 3 is a sectional view taken along line B-B in FIG. 1.
Figure 4:
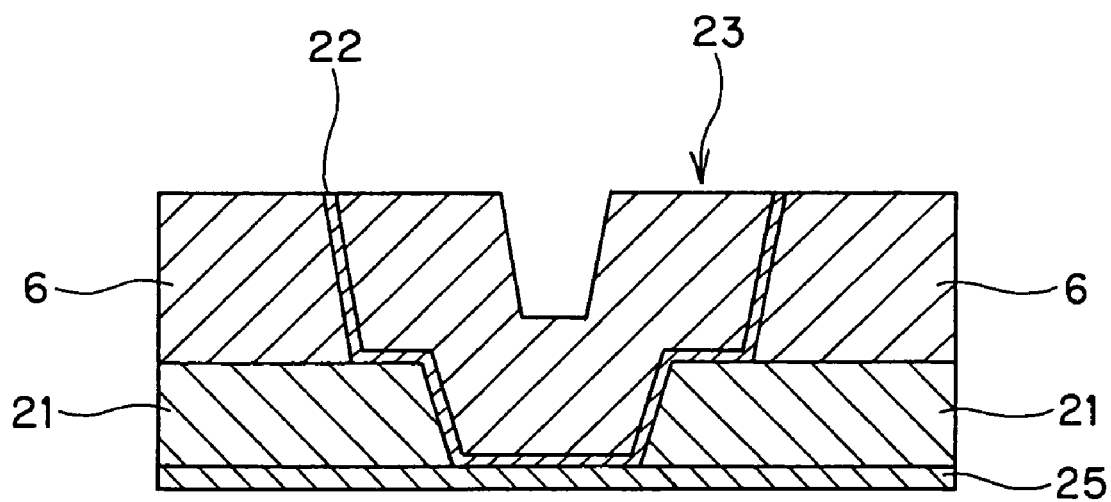
FIG. 4 is a sectional view taken along line C-C in FIG. 1.
Figure 5:
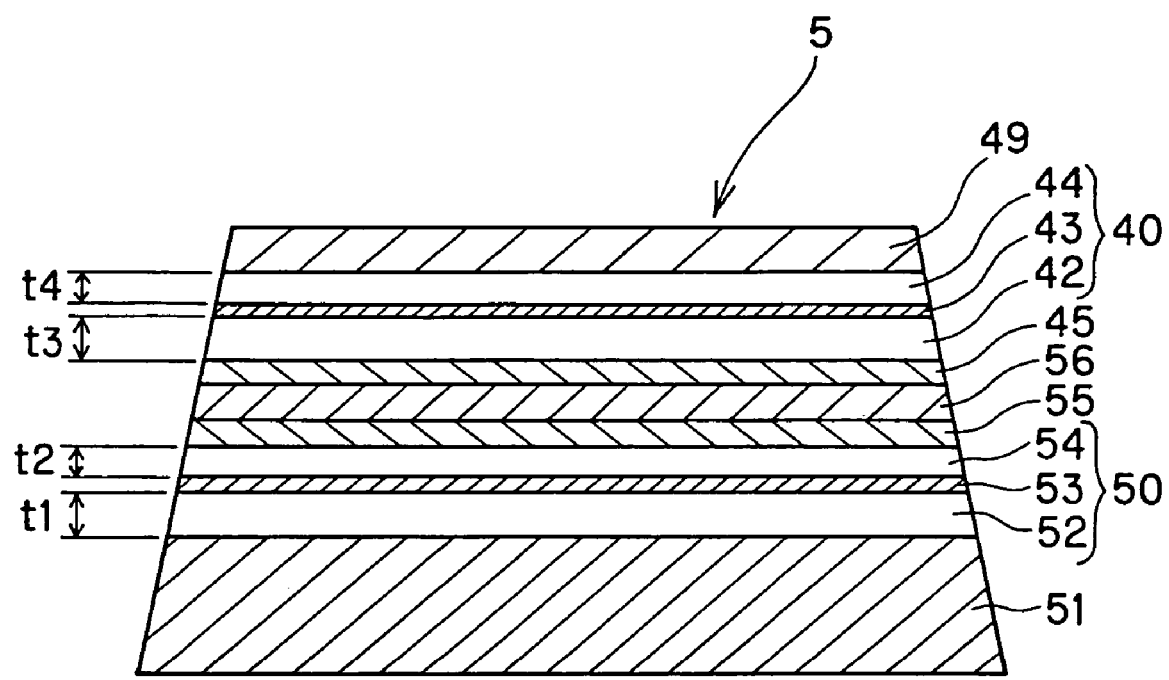
FIG. 5 is a diagram exemplarily showing, in an enlarged manner, a portion of a dual spin-valve magneto-resistive multilayer film in FIG. 2.
Figure 6:
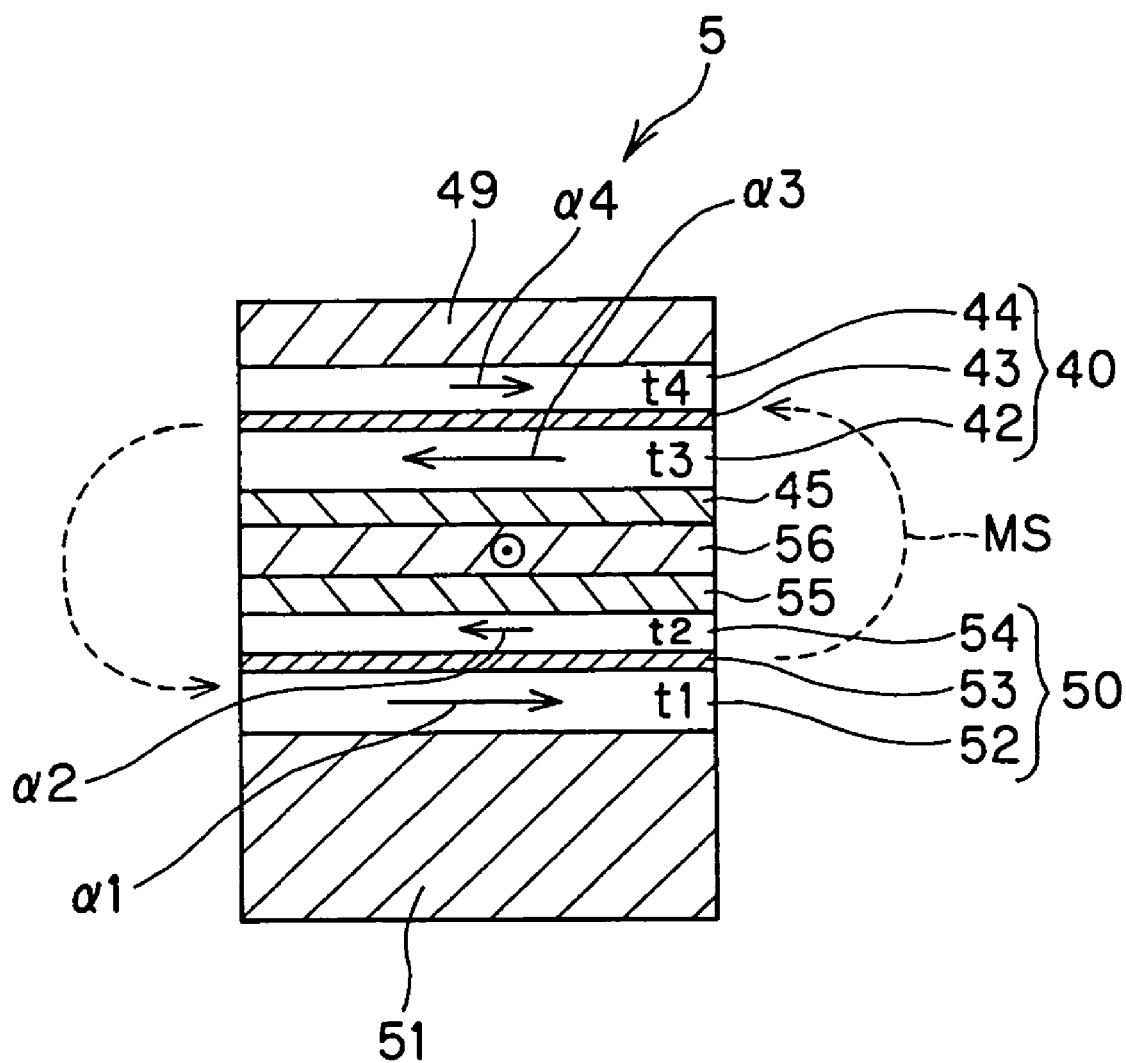
FIG. 6 is a diagram exemplarily showing, in an enlarged manner, a portion of the dual spin-valve magneto-resistive multilayer film in FIG. 3.

FIG. 1 is a plan view showing the main part of a reproducing head in an embodiment of the present invention, FIG. 2 is a sectional view taken along line A-A in FIG. 1, FIG. 3 is a sectional view taken along line B-B in FIG. 1, and FIG. 4 is a sectional view taken along line C-C in FIG. 1. FIG. 5 is a diagram exemplarily showing, in an enlarged manner, a portion of a dual spin-valve magneto-resistive multilayer film in FIG. 2, and FIG. 6 is a diagram exemplarily showing, in an enlarged manner, a portion of the dual spin-valve magneto-resistive multilayer film in FIG. 3.

As shown in FIG. 5, a dual spin-valve magneto-resistive effect multilayer film 5 forming a dual spin-valve magneto-resistive element (MR element) comprises, from the bottom side, a first antiferromagnetic layer 51, a first fixed magnetic layer 50, a first nonmagnetic layer 55, a soft magnetic layer 56, a second nonmagnetic layer 45, and a second fixed magnetic layer 40.

The first fixed magnetic layer 50 located on the lower side in FIG. 5 is formed as a so-called synthetic ferrimagnetic fixed layer. The first fixed magnetic layer 50 comprises a first magnetic layer 52 contacting with the first antiferromagnetic layer 51 and having a magnetization direction fixed by an exchange coupling magnetic field of the first antiferromagnetic layer 51, and a second magnetic layer 54 stacked relative to the first magnetic layer 52 via a nonmagnetic intermediate layer 53 interposed therebetween. The first magnetic layer 52 and the second magnetic layer 54 in the first fixed magnetic layer 50 have antiferromagnetic coupling via the nonmagnetic intermediate layer 53 such that magnetizations of the respective ferromagnetic layers are oriented antiparallel to each other.

Likewise, the second fixed magnetic layer 40 located on the upper side in FIG. 5 is also formed as a synthetic ferrimagnetic fixed layer. Specifically, the second fixed magnetic layer 40 comprises a third magnetic layer 42 located on the side of the second nonmagnetic layer 45, and a fourth magnetic layer 44 stacked relative to the third magnetic layer 42 via a nonmagnetic intermediate layer 43 interposed therebetween, wherein the third magnetic layer 42 and the fourth magnetic layer 44 have antiferromagnetic coupling via the nonmagnetic intermediate layer 43 such that magnetizations of the respective ferromagnetic layers are oriented antiparallel to each other.

On the side of the second fixed magnetic layer 40 in the present invention, there exists no antiferromagnetic layer for fixing its magnetization direction. Therefore, in the present invention, as shown in FIG. 6, a static magnetic field MS (exemplarily illustrated in dotted lines in the figure) produced from end portions of the first fixed magnetic layer 50 located on the lower side in the figure acts to assist and fix the magnetization of the second fixed magnetic layer 40. Further, in FIG. 6, a sense current is caused to flow in a direction where a magnetic field generated by the sense current assists in fixing the magnetization of the third ferromagnetic layer 42 and the fourth ferromagnetic layer 44 forming the second fixed magnetic layer 40, i.e. in a direction perpendicular to the drawing sheet of FIG. 6 from the back to the fore. The value of the sense current is set to 1.5 to 5.0 mA, and preferably 2.0 to 4.0 mA. It is considered that the magnetization fixing assist effect achieved by the sense current is greater than the magnetization fixing assist effect achieved by the static magnetic field produced from the end portions of the ferromagnetic layers and is thus dominant.

In the present invention, given that, as shown in FIGS. 5 and 6, the thickness of the first magnetic layer 52 is t1 and the thickness of the second magnetic layer 54 is t2, both forming the first fixed magnetic layer 50 located on the lower side, and the thickness of the third magnetic layer 42 is t3 and the thickness of the fourth magnetic layer 44 is t4, both forming the second fixed magnetic layer 40 located on the upper side, a relationship is established such that (i) when t1>t2, t3>t4, while, (ii) when t2>t1, t4>t3.

In consideration of forming the multilayer film by repetition of these layers, it is desirable that these layers have the same composition in terms of easiness of the film formation and easiness of a film structure design. Unless the inequality relationship given at (i) or (ii) as noted above is established, the magnetization fixed directions (pinned directions) of the second magnetic layer 54 and the third magnetic layer 42, which substantially function as pinned layers of the dual spin valve, do not coincide with each other so that no output is produced.

In addition to the inequality relationship about the film thicknesses as described above, the following thickness restriction is further imposed.

Specifically, it is configured such that a value of |t1−t2| representing an absolute value of a difference in film thickness between t1 and t2 falls within the range of 2 to 6 Å, and a value of |t3−t4| representing an absolute value of a difference in film thickness between t3 and t4 falls within the range of 2 to 6 Å.

When the value of |t1−t2| becomes less than 2 Å, there arises a problem that, for example, the rate of occurrence of pinning reversal failure, where the polarity is reversed during operation of a head, becomes extremely high. On the other hand, when the value of |t1−t2| exceeds 6 Å, there arises a tendency that the shunt loss of a spin valve increases so that the output is degraded. Similarly, when the value of |t3−t4| becomes less than 2 Å, there arises a problem that, for example, the rate of occurrence of pinning reversal failure, where the polarity is reversed during operation of a head, becomes critically high. On the other hand, when the value of |t3−t4| exceeds 6 Å, there arises a tendency that the shunt loss of a spin valve increases so that the output is degraded.

Further, in the present invention, an absolute value |λ| of a magnetostrictive constant λ of each of the third magnetic layer 42 and the fourth magnetic layer 44 forming the second fixed magnetic layer 40 is preferably set to $5 \times 10^{-6}$ or less, particularly $0 \times 10^{-6}$ to $3 \times 10^{-6}$, and more preferably $0.5 \times 10^{-6}$ to $1.5 \times 10^{-6}$.

When the absolute value of the magnetostrictive constant exceeds $5 \times 10^{-6}$ so that the magnetostrictive constant becomes too large, so-called pinned direction failure, where the pinned direction does not coincide with a prescribed direction, tends to occur easily. Specifically, when the magnetostrictive constant is large, there occurs a phenomenon such that, because of processing stress caused by cutting a wafer into bars each including many thin film magnetic heads and further cutting each bar into the individual magnetic heads, or the like, pinned directions of pinned magnetic layers of the magnetic heads deviate from a proper direction or the pinned directions are reversed and not returned to the proper direction. It is considered that when the absolute value of the magnetostrictive constant is large, because of a coercive force induced by processing strain, the pinned direction is fixed in an unwanted direction at a certain probability (e.g. 50%) and becomes uncontrollable by a static magnetic field from a magnetic layer fixed to an antiferromagnetic layer and a sense current magnetic field.

In the present invention, as described above, it is preferable that the first magnetic layer 52 and the second magnetic layer 54 forming the first fixed magnetic layer 50 being the synthetic ferrimagnetic fixed layer and the third magnetic layer 42 and the fourth magnetic layer 44 forming the second fixed magnetic layer 40 being the synthetic ferrimagnetic fixed layer be made of the same composition material. As the preferred material, there is cited CoFe (the content of Co is 70 to 89 at %, preferably 70 to 85 at %, and more preferably 70 to 80 at %) or the like. Speaking of CoFe, by setting the content of Co in CoFe within the preferred range of 70 to 89 at %, there is achieved an effect that a positive magnetostriction within the scope of the present invention can be obtained within a prescribed film thickness region of the present invention associated with this material.

It is desirable that the thickness t1 of the first magnetic layer 52 be set in the range of 5 to 30 Å, and preferably 10 to 18 Å. It is desirable that the thickness t2 of the second magnetic layer 54 be set in the range of 5 to 30 Å, and preferably 10 to 18 Å. It is desirable that the thickness t3 of the third magnetic layer 42 be set in the range of 5 to 30 Å, and preferably 10 to 18 Å. It is desirable that the thickness t4 of the fourth magnetic layer 44 be set in the range of 5 to 30 Å, and preferably 10 to 18 Å. By setting t1, t2, t3, and t4 in the preferred range of 10 to 18 Å, there is exhibited an effect that the magnetostriction required in this application can be achieved in combination with the foregoing composition range of CoFe.

The nonmagnetic intermediate layers 43 and 53 each being an intermediate layer of the synthetic ferrimagnetic fixed layer are each preferably made of Ru or a Ru—Cr alloy and each preferably have a thickness of, for example, 5 to 8 Å. Other than Ru, Ir, Rh, or the like can be used as amaterial of the nonmagnetic intermediate layers 43 and 53.

As a material of the first antiferromagnetic layer 51, there can be cited a Mn alloy containing at least one kind selected from a group of Ir, Rh, Ru, Pt, and Ni (preferably IrMn, MnPt), and there can be cited NiO, $Fe_2O_3$, CoO, or the like, as a preferred example. Such a first antiferromagnetic layer 51 applies unidirectional anisotropy due to exchange coupling to the adjacent first ferromagnetic layer 52 and acts to substantially fix the magnetization direction of the first ferromagnetic layer 52.

The thickness of the first antiferromagnetic layer 51 is set to, for example, about 70 Å.

The first nonmagnetic layer 55 and the second nonmagnetic layer 45 are each formed by, for example, a nonmagnetic conductive film such as a Cu film. The thickness of each layer is set to, for example, about 17 Å.

The soft magnetic layer 56 located between the first nonmagnetic layer 55 and the second nonmagnetic layer 45 is a layer (so-called free layer) of which a magnetization direction changes depending on a signal magnetic field from a recording medium, and is normally formed by a soft magnetic film. The soft magnetic layer 56 is not limited to a single-layer structure but may be formed into a structure of a multilayer film that acts like a soft magnetic film. The thickness thereof is set to, for example, about 20 Å.

The total thickness of the whole dual spin-valve magnetoresistive effect multilayer film thus structured is set to 150 to 350 Å.

Hereinbelow, the operation of the main part of the present invention will be described again in a summarized manner.

Operation of Main Part of the Present Invention

As shown in FIG. 6, the first antiferromagnetic layer 51 applies unidirectional anisotropy due to exchange coupling to the adjacent first ferromagnetic layer 52 to thereby substantially fix the magnetization direction of the first ferromagnetic layer 52 (arrow α1). The second ferromagnetic layer 54 has antiferromagnetic coupling with the first ferromagnetic layer 52 via the nonmagnetic intermediate layer 53 such that the magnetizations of the respective ferromagnetic layers are oriented antiparallel to each other (arrow α2). The third ferromagnetic layer 42 and the fourth ferromagnetic layer 44 are magnetized (arrows α3 and α4) by a static magnetic field produced at the end portions of the first ferromagnetic layer 52 and the second ferromagnetic layer 54. Accordingly, as different from the conventional spin-valve structure wherein the fixation by the antiferromagnetic film is essential, the magnetization of the third ferromagnetic layer 42 and the fourth ferromagnetic layer 44 forming the second fixed magnetic layer 40 is fixed without an antiferromagnetic layer. In FIG. 6, the sense current is flowing in the direction perpendicular to the drawing sheet from the back to the fore and a magnetic field produced by the sense current acts in a direction to assist in fixing the magnetization of the third ferromagnetic layer 42 and the fourth ferromagnetic layer 44 forming the second fixed magnetic layer 40.

The magnetization direction (arrow α2) of the second ferromagnetic layer 54 and the magnetization direction (arrow α3) of the third ferromagnetic layer 42 coincide with each other and are substantially parallel to a magnetic field to be sensed and approximately perpendicular to the magnetization direction of the soft magnetic layer 56 (free layer) in a zero magnetic field. Accordingly, the second ferromagnetic layer 54 and the soft magnetic layer 56 (free layer) operate as a spin valve and simultaneously the third ferromagnetic layer 42 and the soft magnetic layer 56 (free layer) operate as a spin valve, thereby operating as a dual spin valve. In the present invention, the improvement in resistance change rate attendant on the dual spin-valve structure is realized by the single antiferromagnetic layer 51 on one side.

Such a dual spin-valve magneto-resistive effect multilayer film forming the dual spin-valve magneto-resistive element (MR element) is formed on, for example, an underlayer 25 as shown in FIG. 2. It is desirable that the underlayer 25 be provided taking into account the crystallinity and orientation of the first antiferromagnetic layer 51 located in the lower part of the multilayer film. For example, NiCr or the like is preferably used as a material of the underlayer 25.

Normally, a protective film 49 is formed on the dual spin-valve magneto-resistive effect multilayer film. For example, Ta is used as a material of the protective film 49.

Then, as shown in FIG. 2, at both ends 5e and 5f of at least the soft magnetic layer 56 of the magneto-resistive effect film 5 forming the dual spin-valve magneto-resistive element (MR element) in the present invention, a pair of bias magnetic field applying layers 21 and 21 are disposed, respectively, for applying a longitudinal bias magnetic field to the soft magnetic layer 56. On the bias magnetic field applying layers 21 and 21, two electrode layers 6 and 6 are formed for causing a sense current, being a current for magnetic signal detection, to flow through the magneto-resistive effect film 5 forming the MR element.

Each bias magnetic field applying layer 21 is in the form of, for example, a permanent magnet or a stacked body of a ferromagnetic layer and an antiferromagnetic layer. Each electrode layer 6 is made of a conductive material such as Au.

Other Structural Portions of Reproducing Head

Supplementary description will be briefly made of the structure of the reproducing head illustrated in FIGS. 1 to 4.

In the embodiment illustrated in FIGS. 1 to 4, the reproducing head has a magnetic flux guide layer 23 disposed via an insulating layer 22 on a side of the MR element opposite to its other side where an air bearing surface 20 is formed, for guiding a signal magnetic flux from a recording medium to the MR element. In the present invention, the magnetic flux guide layer 23 is not essential, i.e. the reproducing head may, of course, be of the type that is not provided with the magnetic flux guide layer 23.

The magneto-resistive effect film 5 forming the MR element has two surfaces 5a and 5b facing opposite sides, an end portion 5c located at the air bearing surface 20, an end portion 5d on an opposite side relative to the end portion 5c, and two side portions 5e and 5f.

As described above, the bias magnetic field applying layers 21 and 21 are disposed so as to be adjacent to the side portions 5e and 5f of the magneto-resistive effect film 5 forming the MR element, respectively. The electrode layers 6 and 6 are disposed on the bias magnetic field applying layers 21 and 21 and, in a region where the bias magnetic field applying layers 21 and 21 are not formed, the electrode layers 6 and 6 are disposed on a later-described lower shield gap film.

The magnetic flux guide layer 23, which is formed as a preferred mode of the present invention, is disposed between the two bias magnetic field applying layers 21 and 21 and between the two electrode layers 6 and 6. As a material of the magnetic flux guide layer 23, use is preferably made of a soft magnetic material excellent in soft magnetic property.

In FIGS. 2 to 4, it is illustrated that the magneto-resistive effect film 5 forming the MR element, the bias magnetic field applying layers 21 and 21, and the insulating layer 22 are disposed on the underlayer 25. The underlayer 25 is disposed on the later-described lower shield gap film. Note that the magneto-resistive effect film 5 forming the MR element, the bias magnetic field applying layers 21 and 21, and the insulating layer 22 may be disposed on the lower shield gap film without providing the underlayer 25.

The multilayer film structure of the dual spin-valve magneto-resistive element (MR element) in the present invention is limited to the foregoing dual spin-valve magneto-resistive effect multilayer film structure wherein the first antiferromagnetic layer 51 is located on the bottom side as shown in FIGS. 2 and 5. While reduction in thickness of the whole element has been advancing, the antiferromagnetic layer near the underlayer can be formed as an excellent film with high reliability under the influence of the underlayer.

Overall Structure of Thin Film Magnetic Head

Figure 7:
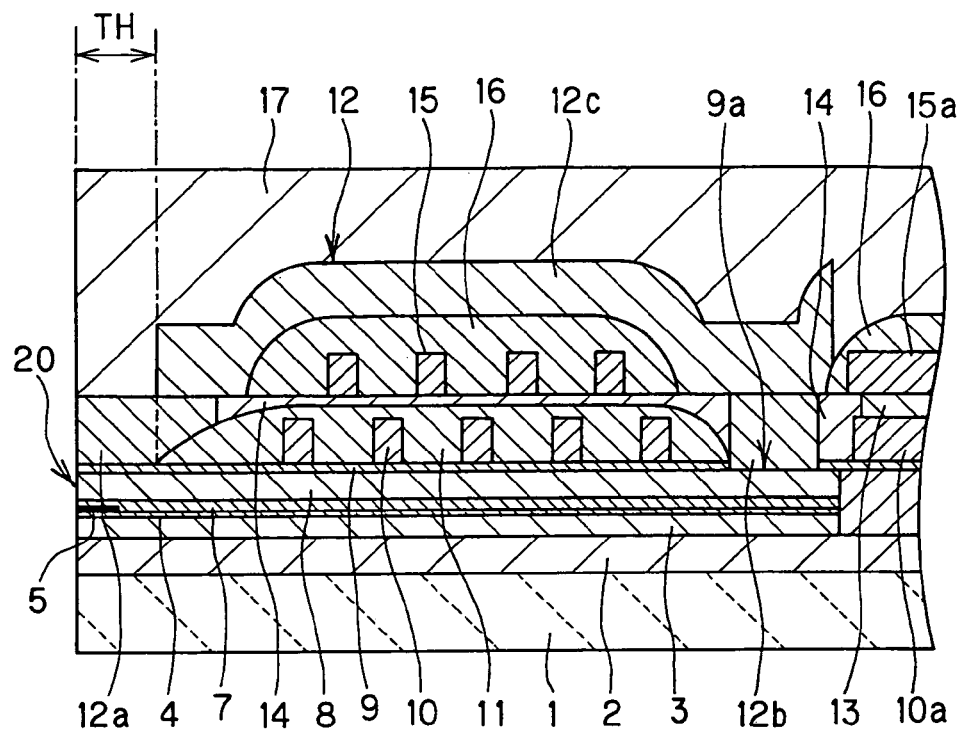
FIG. 7 is a diagram for describing a structure of a thin film magnetic head according to a preferred embodiment of the present invention, which shows a section of the thin film magnetic head perpendicular to an air bearing surface and a substrate.
Figure 8:
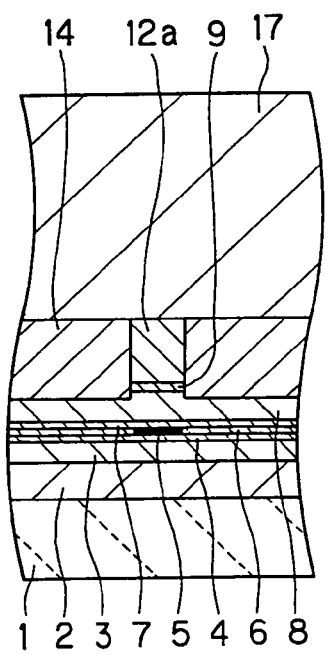
FIG. 8 is a diagram for describing a structure of the thin film magnetic head according to the preferred embodiment of the present invention, which shows a section of a magnetic pole portion of the thin film magnetic head parallel to the air bearing surface.

Now, description will be made of the overall structure of a thin film magnetic head having the foregoing magneto-resistive effect element. FIGS. 7 and 8 are diagrams for describing the structure of the thin film magnetic head according to a preferred embodiment of the present invention, wherein FIG. 7 shows a section of the thin film magnetic head perpendicular to an air bearing surface and a substrate, and FIG. 8 shows a section of a magnetic pole portion of the thin film magnetic head parallel to the air bearing surface. Herein, the air bearing surface represents a confronting surface of the thin film magnetic head confronting a magnetic recording medium.

It is expected that the overall structure of the thin film magnetic head can be easily understood by description along production processes thereof. To this end, the overall structure of the thin film magnetic head will be described hereinbelow on the basis of the production processes.

First, an insulating layer 2 made of an insulating material such as alumina ($Al_2O_3$) or silicon dioxide ($SiO_2$) is formed on a substrate 1 made of a ceramic material such as altic ($Al_2O_3$.Tic) by sputtering or the like. The thickness of the insulting layer 2 is set to, for example, about 0.5 to 20 µm.

Then, on the insulating layer 2 is formed a lower shield layer 3 for a reproducing head, made of a magnetic material. The thickness thereof is set to, for example, about 0.1 to 5 µm. As the magnetic material of the lower shield layer 3, there can be cited, for example, FeAlSi, NiFe, CoFe, CoFeNi, FeN, FeZrN, FeTaN, CoZrNb, or CoZrTa. The lower shield layer 3 is formed by sputtering, plating, or the like.

Then, a lower shield gap film 4 made of an insulating material such as $Al_2O_3$ or $SiO_2$ is formed on the lower shield layer 3 by sputtering or the like. The thickness thereof is set to, for example, about 10 to 200 nm.

Then, the dual spin-valve magneto-resistive effect multilayer film 5 for reproduction, the bias magnetic field applying layers 21 and 21 (not illustrated), and the electrode layers 6 and 6 are formed on the lower shield gap film 4 for forming the dual spin-valve magneto-resistive element (MR element).

Then, an upper shield gap film 7 made of an insulating material such as alumina is formed in a thickness of, for example, 10 to 200 nm on the MR element and the lower shield gap film 4 by sputtering or the like.

Then, an upper shield layer 8 of the reproducing head made of a magnetic material and serving also as a lower magnetic pole layer of a recording head is formed in a thickness of, for example, about 3 to 4 µm on the upper shield gap film 7. The magnetic material of the upper shield layer 8 may be the same as that of the foregoing lower shield layer 3. The upper shield layer 8 is formed by sputtering, plating, or the like.

Incidentally, the upper shield layer 8 may be replaced with an upper shield layer, a separation layer made of a nonmagnetic material such as alumina and formed on the upper shield layer by sputtering or the like, and a lower magnetic pole layer formed on the separation layer. This is an example of the structure wherein functions of a magnetic pole and a shield are not achieved by one layer, but achieved by separate layers.

Then, a recording gap layer 9 made of an insulating material such as alumina is formed in a thickness of, for example, 50 to 300 nm on the upper shield layer 8 by sputtering or the like.

Then, the recording gap layer 9 is partly etched to form a contact hole 9a at a central portion of a later-described thin film coil for forming a magnetic circuit.

Then, a first layer portion 10 of the thin film coil made of, for example, copper (Cu) is formed in a thickness of, for example, 2 to 3 μm on the recording gap layer 9. In FIG. 7, symbol 10a denotes a connecting portion of the first layer portion 10 that is connected to a later-described second layer portion 15 of the thin film coil. The first layer portion 10 is wound around the contact hole 9a.

Then, an insulating layer 11, such as a photoresist, made of an organic material having fluidity upon heating is formed into a predetermined pattern so as to cover the first layer portion 10 of the thin film coil and the recording gap layer 9 in a peripheral region thereof.

Then, a heat treatment is carried out at a predetermined temperature for flattening the surface of the insulating layer 11. By this heat treatment, respective edge portions on the outer periphery and inner periphery of the insulating layer 11 are formed into a rounded slope shape.

Then, in a region from a slope portion of the insulating layer 11 on the side of the later-described air bearing surface 20 over the side of the air bearing surface 20, a track width regulating layer 12a of an upper magnetic pole-layer 12 is formed on the recording gap layer 9 and the insulating layer 11 using a magnetic material for the recording head. The upper magnetic pole layer 12 comprises the track width regulating layer 12a, a later-described coupling portion layer 12b, and a later-described yoke portion layer 12c.

The track width regulating layer 12a has a tip portion formed on the recording gap layer 9 and serving as a magnetic pole portion of the upper magnetic pole layer 12, and a connecting portion formed on the slope portion of the insulating layer 11 on the side of the air bearing surface 20 and connected to the yoke portion layer 12c. The width of the tip portion is set equal to a recording track width. The width of the connecting portion is set larger than the width of the tip portion.

Upon forming the track width regulating layer 12a, the coupling portion layer 12b made of a magnetic material is simultaneously formed on the contact hole 9a, and further, a connection layer 13 made of a magnetic material is simultaneously formed on the connecting portion 10a. The coupling portion layer 12b constitutes a portion of the upper magnetic pole layer 12, which is magnetically coupled to the upper shield layer 8.

Then, magnetic pole trimming is carried out. Specifically, in a peripheral region of the track width regulating layer 12a, at least part of the recording gap layer 9 and a magnetic pole portion of the upper shield layer 8 on the side of the recording gap layer 9 is etched using the track width regulating layer 12a as a mask. Thereby, as shown in FIG. 8, a trim structure is formed wherein respective widths of at least part of the magnetic pole portion of the upper magnetic pole layer 12, the recording gap layer 9, and the magnetic pole portion of the upper shield layer 8 are made even. According to this trim structure, it is possible to prevent the increase in effective track width which is caused by spreading of magnetic flux in the neighborhood of the recording gap layer 9.

Then, an insulating layer 14 made of an inorganic insulating material such as alumina is formed over the whole in a thickness of, for example, 3 to 4 μm.

Then, the insulating layer 14 is polished by, for example, chemical mechanical polishing to the surfaces of the track width regulating layer 12a, the coupling portion layer 12b, and the connection layer 13, to thereby carry out flattening.

Then, on the flattened insulating layer 14, the second layer portion 15 of the thin film coil made of, for example, copper (Cu) is formed in a thickness of, for example, 2 to 3 μm. In FIG. 7, symbol 15a denotes a connecting portion of the second layer portion 15, which is connected to the connecting portion 10a of the first layer portion 10 of the thin film coil via the connection layer 13. The second layer portion 15 is wound around the coupling portion layer 12b.

Then, an insulating layer 16, such as a photoresist, made of an organic material having fluidity upon heating is formed into a predetermined pattern so as to cover the second layer portion 15 of the thin film coil and the insulating layer 14 in a peripheral region thereof.

Then, a heat treatment is carried out at a predetermined temperature for flattening the surface of the insulating layer 16. By this heat treatment, respective edge portions on the outer periphery and inner periphery of the insulating layer 16 are formed into a rounded slope shape.

Then, the yoke portion layer 12c forming a yoke portion of the upper magnetic pole layer 12 is formed on the track width regulating layer 12a, the insulating layers 14 and 16, and the coupling portion layer 12b, using a magnetic material for the recording head such as Permalloy. An end portion of the yoke portion layer 12c on the side of the air bearing surface 20 is located at a position apart from the air bearing surface 20. The yoke portion layer 12c is connected to the upper shield layer 8 via the coupling portion layer 12b.

Then, an overcoat layer 17 made of, for example, alumina is formed so as to cover the whole. Finally, mechanical processing is applied to a slider including the foregoing respective layers to form the air bearing surface 20 of the thin film magnetic head including the recording head and the reproducing head, so that the thin film magnetic head is completed.

The thin film magnetic head thus produced comprises the confronting surface (air bearing surface 20) confronting the recording medium, the reproducing head, and the recording head (induction-type electromagnetic transducer element). The reproducing head comprises the MR element (magneto-resistive effect film 5), and the lower shield layer 3 and the upper shield layer 8 for shielding the MR element (magneto-resistive effect film 5). The lower shield layer 3 and the upper shield layer 8 have portions on the side of the air bearing surface 20, which are disposed to confront each other with the MR element (magneto-resistive effect film 5) sandwiched therebetween.

The recording head includes the magnetic pole portions confronting each other on the side of the air bearing surface 20, and comprises the lower magnetic pole layer (upper shield layer 8) and the upper magnetic pole layer 12 magnetically coupled to each other, the recording gap layer 9 provided between the magnetic pole portion of the lower magnetic pole layer and the magnetic pole portion of the upper magnetic pole layer 12, and the thin film coil 10, 15 of which at least part is disposed between the lower magnetic pole layer and the upper magnetic pole layer 12 in an insulated manner against them. In this thin film magnetic head, as shown in FIG. 7, the length from the air bearing surface 20 to an end of the insulating layer 11 on the side of the air bearing surface 20 becomes a throat height (identified by symbol TH in FIG. 7). The throat height represents a length (height) from the air bearing surface 20 to a position where an interval between the two magnetic pole layers starts to increase.

Operation of Thin Film Magnetic Head

Now, description will be made of an operation of the thin film magnetic head according to this embodiment. The thin film magnetic head records information on the recording medium using the recording head, while reproduces information recorded on the recording medium using the reproducing head.

In the reproducing head, because of a longitudinal bias magnetic field applied by the bias magnetic field applying layers 21 and 21, a direction of a substantial longitudinal bias magnetic field substantially applied to the soft magnetic layer 56 is perpendicular to a direction that is perpendicular to the air bearing surface 20. In the magneto-resistive effect film 5 forming the MR element, a magnetization direction of the soft magnetic layer 56 is set to the direction of the bias magnetic field in the state where no signal magnetic field exists. On the other hand, magnetization directions of the second ferromagnetic layer 54 and the third ferromagnetic layer 42 coincide with each other and are fixed to the direction perpendicular to the air bearing surface 20.

In the magneto-resistive effect film 5 forming the MR element, the magnetization direction of the soft magnetic layer 56 changes depending on a signal magnetic field from the recording medium, so that a relative angle between the magnetization direction of the soft magnetic layer 56 and the magnetization direction of the second ferromagnetic layer 54 and the third ferromagnetic layer 42 changes, and consequently, a resistance value of the MR element changes. The resistance value of the MR element can be derived from a potential difference between the two electrode layers 6 and 6 when a sense current is caused to flow through the MR element by the two electrode layers 6 and 6. In this manner, the information recorded on the recording medium can be reproduced by the reproducing head.

Head Gimbal Assembly and Hard Disk Drive

Hereinbelow, description will be made of a head gimbal assembly and a hard disk drive according to an embodiment of the present invention.

Figure 9:
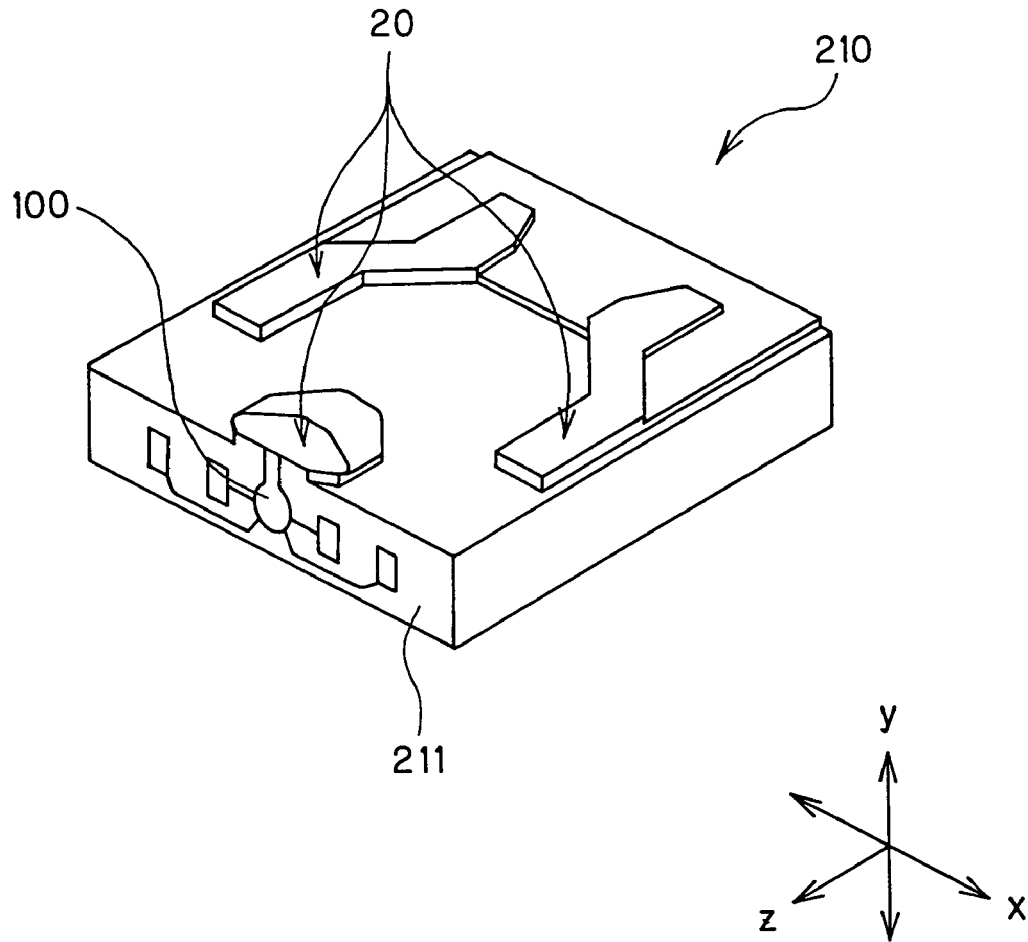
FIG. 9 is a perspective view showing a slider included in a head gimbal assembly in an embodiment of the present invention.

Referring first to FIG. 9, a slider 210 included in the head gimbal assembly will be described. In the hard disk drive, the slider 210 is disposed so as to confront a hard disk serving as a disc-shaped recording medium and driven to be rotated. The slider 210 comprises a base body 211 mainly composed of the substrate 1 and the overcoat layer 17 in FIG. 7.

The base body 211 has a generally hexahedral shape. One surface, among six surfaces, of the base body 211 is arranged to confront the hard disk. This one surface is formed with the air bearing surface 20.

When the hard disk is rotated in a z-direction in FIG. 9, lift is generated below the slider 210 in a y-direction in FIG. 9 because of an air flow passing between the hard disk and the slider 210. This lift causes the slider 210 to rise from the surface of the hard disk. Incidentally, an x-direction in FIG. 9 represents a track traverse direction of the hard disk.

A thin film magnetic head 100 according to this embodiment is formed in the neighborhood of an end portion (lower-left end portion in FIG. 9) of the slider 210 on an air exit side thereof.

Figure 10:
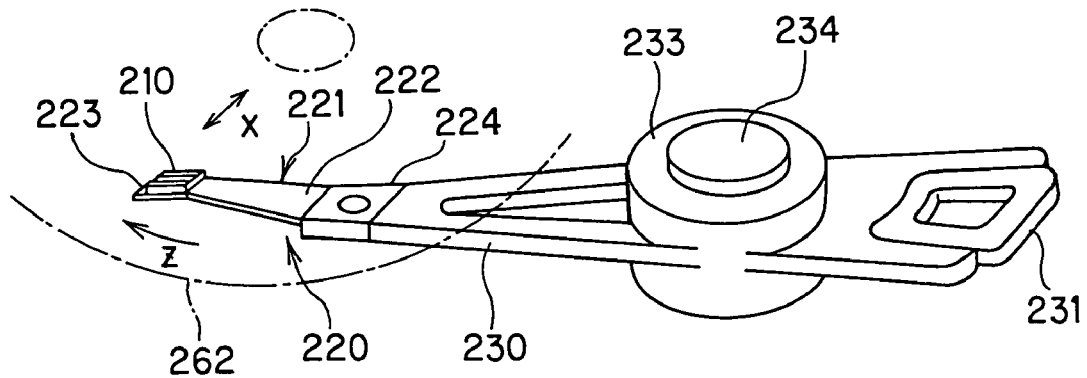
FIG. 10 is a perspective view showing a head arm assembly including the head gimbal assembly in the embodiment of the present invention.

Referring now to FIG. 10, description will be made of a head gimbal assembly 220 according to this embodiment. The head gimbal assembly 220 comprises the slider 210, and a suspension 221 elastically supporting the slider 210. The suspension 221 comprises a load beam 222 in the form of a blade spring made of, for example, stainless steel, a flexure 223 provided at one end of the load beam 222 and joined with the slider for giving a suitable degree of freedom to the slider 210, and a base plate 224 provided at the other end of the load beam 222.

The base plate 224 is adapted to be attached to an arm 230 of an actuator for moving the slider 210 in the track traverse direction x of a hard disk 262. The actuator comprises the arm 230 and a voice coil motor for driving the arm 230. In the flexure 223, a portion where the slider 210 is mounted, is provided with a gimbal portion for keeping constant a posture of the slider 210.

The head gimbal assembly 220 is attached to the arm 230 of the actuator. An assembly in which the head gimbal assembly 220 is attached to one arm 230 is called a head arm assembly. On the other hand, an assembly in which a carriage has a plurality of arms and the head gimbal assembly 220 is attached to each of the arms is called a head stack assembly.

FIG. 10 shows one example of the head arm assembly. In this head arm assembly, the head gimbal assembly 220 is attached to one end of the arm 230. To the other end of the arm 230 is attached a coil 231 forming part of the voice coil motor. At an intermediate portion of the arm 230 is provided a bearing portion 233 that is mounted on a shaft 234 for pivotally supporting the arm 230.

Figure 11:
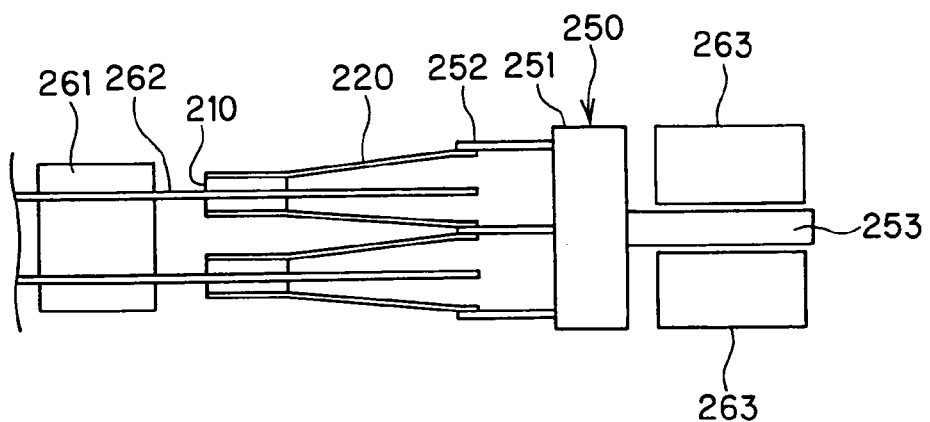
FIG. 11 is an explanatory diagram showing the main part of a hard disk drive in the embodiment of the present invention.
Figure 12:
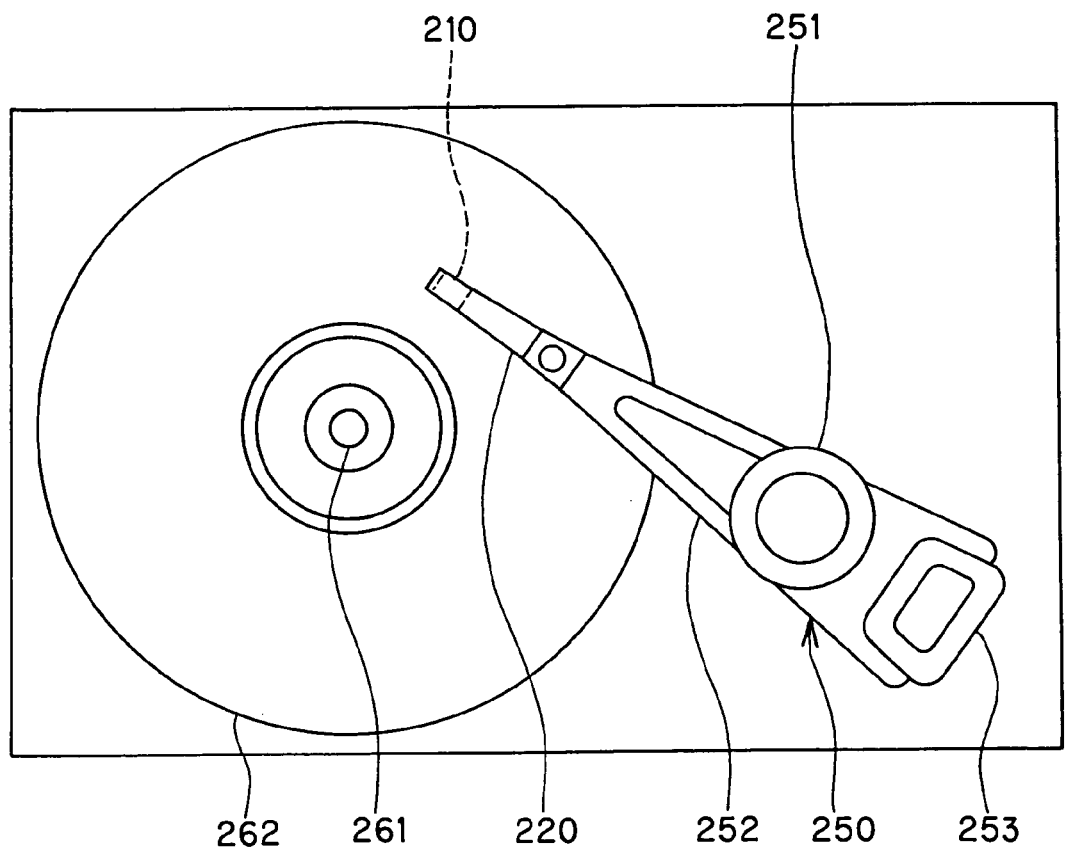
FIG. 12 is a plan view of the hard disk drive in the embodiment of the present invention.

Referring now to FIGS. 11 and 12, description will be made of one example of the head stack assembly and the hard disk drive according to this embodiment.

FIG. 11 is an explanatory diagram showing the main part of the hard disk drive, while FIG. 12 is a plan view of the hard disk drive.

A head stack assembly 250 comprises a carriage 251 having a plurality of arms 252. A plurality of head gimbal assemblies 220 are attached to the arms 252 so as to be adjacent to each other in the vertical direction with an interval therebetween. A coil 253 forming part of a voice coil motor is attached to the carriage 251 on the opposite side relative to the arms 252. The head stack assembly 250 is incorporated into the hard disk drive.

The hard disk drive has a plurality of hard disks 262 mounted on a spindle motor 261. Two sliders 210 are disposed for each of the hard disks 262 so as to confront each other with the hard disk 262 interposed therebetween. The voice coil motor has permanent magnets 263 that are disposed at positions to confront each other with the coil 253 interposed therebetween.

The head stack assembly 250 excluding the sliders 210 and the actuator correspond to a positioning device in the present invention and serve to support the sliders 210 and to position the sliders 210 relative to the hard disks 262.

In the hard disk drive according to this embodiment, the sliders 210 are moved in the track traverse direction of the hard disks 262 and positioned relative to the hard disks 262 by the use of the actuator. The thin film magnetic head included in the slider 210 records information on the hard disk 262 using the recording head, while reproduces information recorded on the hard disk 262 using the reproducing head.

The head gimbal assembly and the hard disk drive according to this embodiment achieve the effect like that achieved by the thin film magnetic head according to the foregoing embodiment.

The description has been made of the thin film magnetic head having the structure wherein the reproducing head is formed on the side of the substrate, then the recording head is stacked thereon. However, this stacking order may be reversed. Further, when used only for reading, the thin film magnetic head may be configured to have only the reproducing head.

The thin film magnetic head of the present invention as described above will be described in further detail based on specific examples shown below.

EXAMPLE 1

Preparation was made of reproducing head samples each having an element comprising a dual spin-valve magneto-resistive effect multilayer film as shown in FIGS. 2 and 5. Hereinbelow, only the main part of implementation will be described.

As shown in FIG. 7, a lower shield layer 3 of NiFe was formed, then a lower shield gap film 4 of $Al_2O_3$ was formed thereon, and then a stacked film constituting a dual spin-valve magneto-resistive effect element was formed thereon.

Specifically, on the lower shield gap film 4 of $Al_2O_3$ was formed the stacked film composed of an underlayer 25 (NiCr; thickness 50 Å), a first antiferromagnetic layer 51 (IrMn antiferromagnetic layer; thickness 70 Å), a first fixed magnetic layer 50 (first magnetic layer 52 ($Co_{80}Fe_{20}$; thickness is given by parameter X(Å) in Table 1 below)/nonmagnetic intermediate layer 53 (Ru; thickness 8 Å)/second magnetic layer 54 ($Co_{80}Fe_{20}$; thickness 15 Å)), a first nonmagnetic layer 55 (Cu; thickness 17 Å), a soft magnetic layer 56 ($Co_{90}Fe_{10}$; thickness 20 Å), a second nonmagnetic layer 45 (Cu; thickness 17 Å), a second fixed magnetic layer 40 (third magnetic layer 42 ($Co_{80}Fe_{20}$; thickness is given by parameter X(Å) in Table 1 below)/nonmagnetic intermediate layer 43 (Ru; thickness 8 Å)/fourth magnetic layer 44 ($Co_{80}Fe_{20}$; thickness 15 Å)), and a protective layer 49 (Ta; thickness 20 Å).

Fixation of a magnetization direction of the first magnetic layer 52 by the first antiferromagnetic layer 51 was carried out in a vacuum by a heat treatment wherein a temperature was 270° C., an applied magnetic field was 790 kA/m (10 kOe), and a treatment time was 5 hours.

After performing the heat treatment for fixing the magnetization direction of the first magnetic layer 52, a mask was formed on the magneto-resistive effect film for defining a shape of the MR element by etching. This mask was formed by patterning a resist layer made of two organic films to have a shape with an undercut to make a bottom surface smaller than an upper surface.

The magneto-resistive effect film was selectively subjected to dry etching such as ion milling by the use of the mask to thereby obtain a patterned magneto-resistive effect element. Then, bias magnetic field applying layers 21 and 21 (CoCrPt; thickness 20 nm for each) were formed on the underlayer 25. Then, electrode layers 6 and 6 (Au; thickness 40 nm for each) were formed on the bias magnetic field applying layers 21 and 21.

The magnitude of the reproduction track width was such that the optical track width was 100 nm and the effective track width was 125 nm.

The bias magnetic field applying layers 21 and 21 were magnetized under the magnetization condition at room temperature in a magnetic field of 948 kA/m (12 kOe) for 60 seconds to thereby apply a longitudinal bias magnetic field to the soft magnetic layer 56.

On such an MR element were formed an upper shield gap layer of $Al_2O_3$ and an upper shield layer of NiFe to thereby prepare each of various reproducing head samples having different X values (Å), as shown in Table 1 below, each representing the thickness of each of the first magnetic layer 52 and the third magnetic layer 42.

Using the reproducing head samples thus prepared, (1) Solitary Wave Output (mV/pp) and (2) Pinning Reversal Failure Rate (%) were derived in the following manner.

(1) Solitary Wave Output (mV/pp)

Using a spin stand, a 3.5-inch recording medium was rotated at 7200 rpm to fly the sample head thereover and writing was performed on one track of the recording medium at a frequency of 1 MHz. Thereafter, a sense current of 3 mA was caused to flow through the sample head to thereby measure the average reproduction output of one track.

(2) Pinning Reversal Failure Rate (%)

A case where the polarity was reversed during operation was judged to be failure. The number of samples was 100. Specifically, the polarity of pinning was judged using a technique disclosed in JP-A-H10-228614 by the present inventors. In order to generate pinning reversal failure, mechanical damage was applied to the sample head by the following accelerative experimental means. First, a recording medium having a CSS (Constant Start and Stop) zone was prepared and rotated at 1000 rpm to fly the sample head thereover. Writing was performed simultaneously and a spin-valve element portion was projected with respect to an ABS by heat. In this manner, the damage was applied to the spin-valve element portion for one minute. The polarity of pinning was judged before and after the application of the damage.

Figure 13:
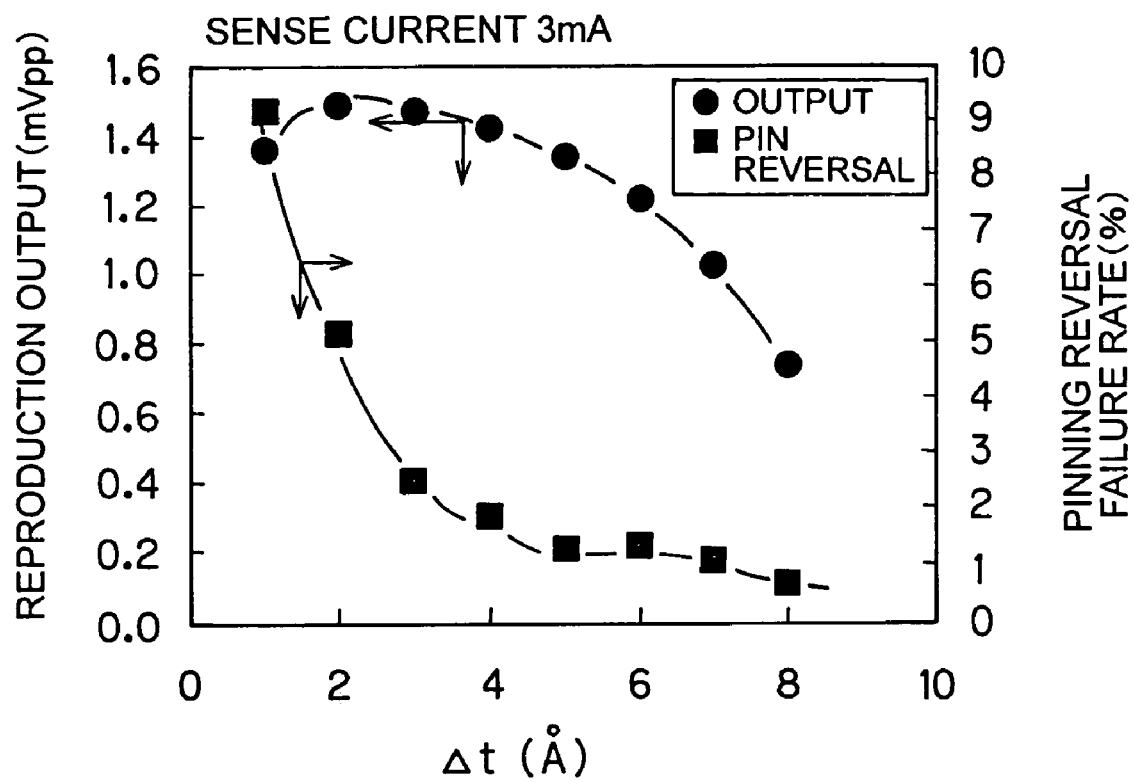
FIG. 13 is a graph showing the results of Table 1.

The results are shown in Table 1 below and also shown in a graph of FIG. 13 for facilitating understanding visually.

TABLE 1

(sense current 3 mA)

|  | Each of t1 and t3 (Å) | $\Delta t = |t1 - t2|$ $\Delta t = |t3 - t4|$ (Å) | Solitary Wave Output (mVpp) | Pinning Reversal Failure Rate (%) |
|---|---|---|---|---|
| 1-1 Sample | 16 | 1 | 1.444 | 11.80 |
| 1-2 Sample | 17 | 2 | 1.520 | 4.60 |
| 1-3 Sample | 18 | 3 | 1.504 | 2.25 |
| 1-4 Sample | 19 | 4 | 1.452 | 1.50 |
| 1-5 Sample | 20 | 5 | 1.370 | 1.56 |
| 1-6 Sample | 21 | 6 | 1.252 | 1.20 |
| 1-7 Sample | 22 | 7 | 1.089 | 0.80 |
| 1-8 Sample | 23 | 8 | 0.840 | 0.80 | t1: Thickness of First Magnetic Layer forming First Fixed Magnetic Layer
t2: Thickness of Second Magnetic Layer forming First Fixed Magnetic Layer = 15 Å
t3: Thickness of Third Magnetic Layer forming Second Fixed Magnetic Layer
t4: Thickness of Fourth Magnetic Layer forming Second Fixed Magnetic Layer = 15 Å

EXAMPLE 2

The structure of the first fixed magnetic layer 50 used in Example 1 was changed to (first magnetic layer 52 ($Co_{80}Fe_{20}$; thickness 15 Å)/nonmagnetic intermediate layer 53 (Ru; thickness 8 Å)/second magnetic layer 54 ($Co_{80}Fe_{20}$; thickness is given by parameter X(Å) in Table 2 below)).

Further, the structure of the second fixed magnetic layer 40 used in Example 1 was changed to (third magnetic layer 42 ($Co_{80}Fe_{20}$; thickness 15 Å)/nonmagnetic intermediate layer 43 (Ru; thickness 8 Å)/fourth magnetic layer 44 ($Co_{80}Fe_{20}$; thickness is given by parameter X(Å) in Table 2 below)) to thereby prepare each of various reproducing head samples having different X values (Å), as shown in Table 2 below, each representing the thickness of each of the second magnetic layer 54 and the fourth magnetic layer 44.

Using the reproducing head samples thus prepared, (1) Solitary Wave Output (mV/pp) and (2) Pinning Reversal Failure Rate (%) were derived in the manner as described above.

Figure 14:
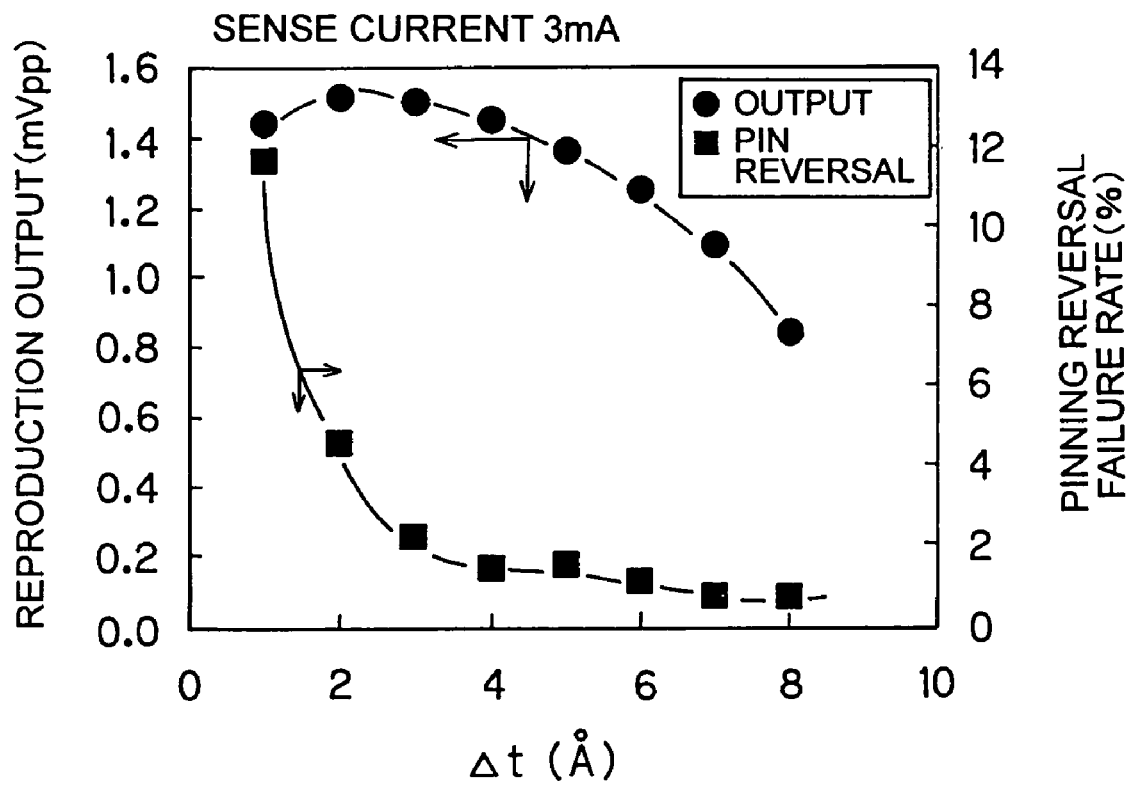
FIG. 14 is a graph showing the results of Table 2.

The results are shown in Table 2 below and also shown in a graph of FIG. 14 for facilitating understanding visually.

TABLE 2

(sense current 3 mA)

| | Each of t2 and t4 (Å) | $\Delta t = |t1 - t2|$ $\Delta t = |t3 - t4|$ (Å) | Solitary Wave Output (mVpp) | Pinning Reversal Failure Rate (%) |
|---|---|---|---|---|
| 2-1 Sample | 16 | 1 | 1.360 | 9.25 |
| 2-2 Sample | 17 | 2 | 1.491 | 5.20 |
| 2-3 Sample | 18 | 3 | 1.472 | 2.53 |
| 2-4 Sample | 19 | 4 | 1.422 | 1.91 |
| 2-5 Sample | 20 | 5 | 1.343 | 1.30 |
| 2-6 Sample | 21 | 6 | 1.215 | 1.36 |
| 2-7 Sample | 22 | 7 | 1.017 | 1.11 |
| 2-8 Sample | 23 | 8 | 0.741 | 0.68 | t1: Thickness of First Magnetic Layer forming First Fixed Magnetic Layer = 15 Å
t2: Thickness of Second Magnetic Layer forming First Fixed Magnetic Layer
t3: Thickness of Third Magnetic Layer forming Second Fixed Magnetic Layer = 15 Å
t4: Thickness of Fourth Magnetic Layer forming Second Fixed Magnetic Layer From the results shown in Tables 1 and 2 and FIGS. 13 and 14, it is understood that, given that the thicknesses of the first magnetic layer 52 and the second magnetic layer 54 forming the first fixed magnetic layer 50 are t1 and t2, respectively, and the thicknesses of the third magnetic layer 42 and the fourth magnetic layer 44 forming the second fixed magnetic layer 40 are t3 and t4, respectively, it is necessary that a value of |t1−t2| representing an absolute value of a difference in film thickness between t1 and t2 be set to 6 Å or less and a value of |t3−t4| representing an absolute value of a difference in film thickness between t3 and t4 be set to 6 Å or less for obtaining high output. It is also understood that, for suppressing the pinning reversal failure rate, it is necessary to set the value of |t1−t2| to 2 Å or more and the value of |t3−t4| to 2 Å or more.

The experiments shown in Tables 1 and 2 were performed under the condition of t1=t3 and t2=t4, but the present invention is not limited thereto. It has been confirmed that even when values of t1 and t3 differ from each other and values t2 and t4 differ from each other, there is achieved an effect showing a tendency similar to the results shown in Tables 1 and 2 as long as the relationship of t1 to t4 satisfies the required condition of the present invention.

Although the sense current may be increased for stabilizing the pinning, it is not possible to feed so much current due to the electromigration limit.

Note that the third magnetic layer and the fourth magnetic layer forming the second fixed magnetic layer used in Examples 1 and 2 each have a physical property that an absolute value of a magnetostrictive constant thereof is $2.5 \times 10^{-6}$.

EXAMPLE 3

The structure of the first fixed magnetic layer 50 used in Example 1 was changed to (first magnetic layer 52 ($Co_{80}Fe_{20}$; thickness 19 Å)/nonmagnetic intermediate layer 53 (Ru; thickness 8 Å)/second magnetic layer 54 ($Co_{80}Fe_{20}$; thickness 15 Å).

Further, the structure of the second fixed magnetic layer 40 used in Example 1 was changed to (third magnetic layer 42 ($Co_yFe_{100-y}$ (y is given in at % and identified by parameters in Table 3 below); thickness 19 Å)/nonmagnetic intermediate layer 43 (Ru; thickness 8 Å)/fourth magnetic layer 44 ($Co_{80}Fe_{20}$; thickness 15 Å) to thereby prepare each of various reproducing head samples having different y values (at %) as shown in Table 3 below.

Using the reproducing head samples thus prepared, (3) Processing Pinning Reversal Failure Rate (%) was derived. Herein, "Processing Pinning Reversal Failure Rate (%)" represents an occurrence rate of pinned direction failure where a pinned direction does not coincide with a required direction due to processing stress caused by cutting a wafer into bars each including many thin film magnetic heads and further cutting each bar into the individual magnetic heads. The number of samples was 200 and the polarity of pinning was judged using the technique disclosed in JP-A-H10-228614 by the present inventors.

The results are shown in Table 3 below and also shown in a graph of FIG. 15 for facilitating understanding visually.

TABLE 3

| | y in Third Magnetic Layer $Co_yFe_{100-y}$ (at %) | Magnetostrictive Constant λ ($\times 10^{-6}$) | Processing Pinning Reversal Failure Rate (%) |
|---|---|---|---|
| 3-1 Sample | 88 | 1.25 | 1.5 |
| 3-2 Sample | 80 | 1.6 | 1.7 |
| 3-3 Sample | 70 | 4.7 | 2.2 |
| 3-4 Sample | 60 | 12.4 | 23.7 |
| 3-5 Sample | 50 | 27.5 | 37.8 |
| 3-6 Sample | 30 | 18.2 | 29.6 |

NiCr50/IrMn70/CoFe19/Ru8/CoFe15/Cu17/CoFe20/Cu17/$Co_yFe_{100-y}$/Ru8/CoFe15

Figure 15:
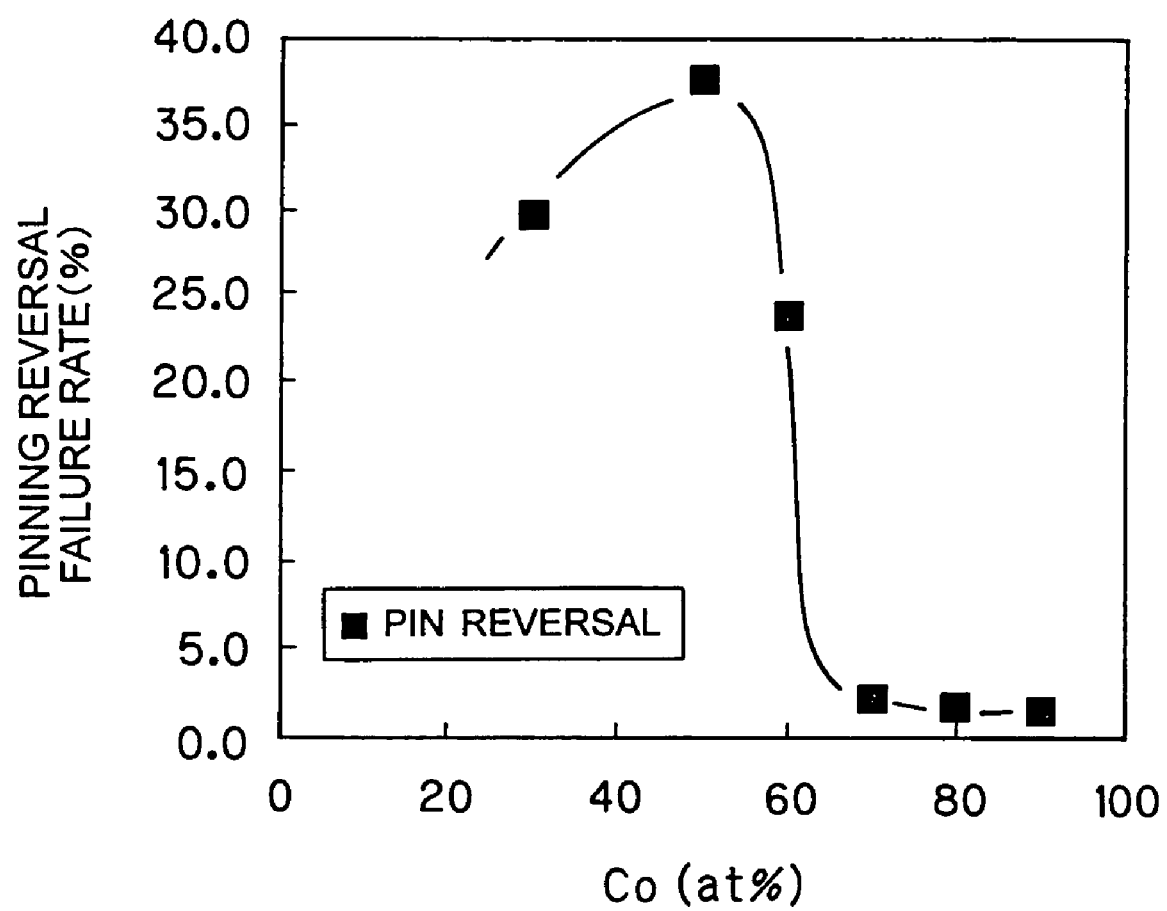
FIG. 15 is a graph showing the results of Table 3.

From the results shown in Table 3 and FIG. 15, when the content of Co in the CoFe layer of the third magnetic layer forming the second fixed magnetic layer of which the magnetization direction is fixed by the static magnetic field becomes less than 70 at %, the magnetostrictive constant increases extremely. It is seen that the magnetostrictive constant in $Co_{70}Fe_{30}$ is $4.7 \times 10^{-6}$ and, when the magnetostrictive constant exceeds $5.0 \times 10^{-6}$, the processing pinning reversal failure is largely affected. It is considered that when the magnetostrictive constant is large, because of a coercive force induced by strain existing in the head after polishing, or the like, the pinned direction is fixed in an unwanted direction at a probability of 50% and becomes uncontrollable even by the static magnetic field and the current magnetic field.

On the other hand, it is considered that when the magnetostrictive constant falls within $5.0 \times 10^{-6}$, since the induced coercive force is small, the pinned direction is controllable by the static magnetic field and the current magnetic field and therefore the processing pinning reversal failure rate is reduced.

EXAMPLE 4

The same samples as in Example 1 were prepared by the same method as in Example 1. That is, there were prepared various reproducing head samples having different X values (Å), as shown in Table 4 below, each representing the thickness of each of the first magnetic layer 52 and the third magnetic layer 42.

With respect to these samples, an experiment was conducted to examine the influence of the value of sense current applied to the dual spin-valve magneto-resistive effect multilayer film. Specifically, using the prepared reproducing head samples, (1) Solitary Wave Output (mV/pp) and (2) Pinning Reversal Failure Rate (%) were derived by changing the value of sense current from 3 mA to 2 mA.

The results are shown in Table 4 below and also shown in a graph of FIG. 16 for facilitating understanding visually.

TABLE 4

(sense current 2 mA)

| | Each of t1 and t3 (Å) | Δt = \|t1 − t2\| Δt = \|t3 − t4\| (Å) | Solitary Wave Output (mVpp) | Pinning Reversal Failure Rate (%) |
|---|---|---|---|---|
| 4-1 Sample | 16 | 1 | 0.95 | 16.38 |
| 4-2 Sample | 17 | 2 | 1.02 | 6.12 |
| 4-3 Sample | 18 | 3 | 1.01 | 3.12 |
| 4-4 Sample | 19 | 4 | 0.97 | 1.87 |
| 4-5 Sample | 20 | 5 | 0.92 | 2.21 |
| 4-6 Sample | 21 | 6 | 0.85 | 1.72 |
| 4-7 Sample | 22 | 7 | 0.71 | 1.13 |
| 4-8 Sample | 23 | 8 | 0.54 | 1.23 |

NiCr50/IrMn70/CoFe(X)/Ru8/CoFe15/Cu17/CoFe20/Cu17/CoFe(X)/Ru8/CoFe15/Ta20
t1: Thickness of First Magnetic Layer forming First Fixed Magnetic Layer = X
t2: Thickness of Second Magnetic Layer forming First Fixed Magnetic Layer = 15 Å
t3: Thickness of Third Magnetic Layer forming Second Fixed Magnetic Layer = X
t4: Thickness of Fourth Magnetic Layer forming Second Fixed Magnetic Layer = 15 Å

Figure 16:
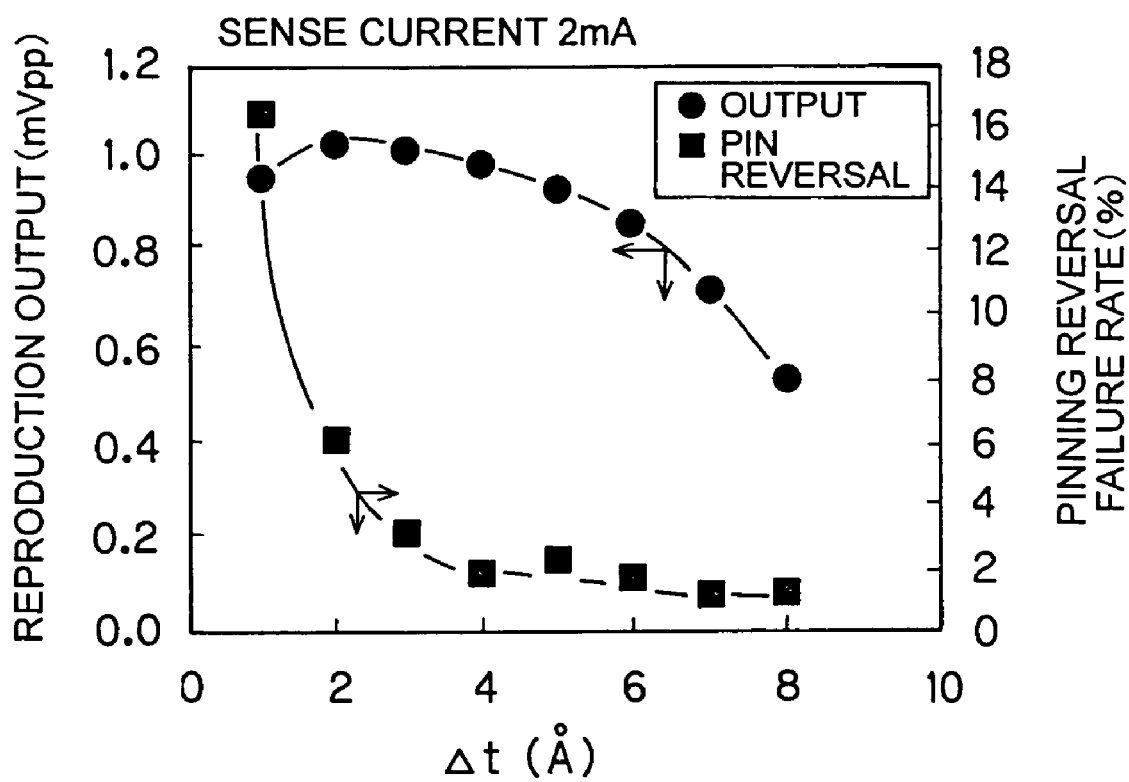
FIG. 16 is a graph showing the results of Table 4.

From the results shown in Table 4 and FIG. 16, it is understood that, given that the thicknesses of the first magnetic layer 52 and the second magnetic layer 54 forming the first fixed magnetic layer 50 are t1 and t2, respectively, and the thicknesses of the third magnetic layer 42 and the fourth magnetic layer 44 forming the second fixed magnetic layer 40 are t3 and t4, respectively, there is observed a tendency of necessity that a value of |t1−t2| representing an absolute value of a difference in film thickness between t1 and t2 be set to 6 Å or less and a value of |t3−t4| representing an absolute value of a difference in film thickness between t3 and t4 be set to 6 Å or less for obtaining high output. It is also understood that, for suppressing the pinning reversal failure rate, there is observed a tendency of necessity to set the value of |t1−t2| to 2 Å or more and the value of |t3−t4| to 2 Å or more.

It was confirmed that these tendencies were the same also in an experiment performed according to the same manner as in Example 2 wherein the thickness of each of the second magnetic layer 54 and the fourth magnetic layer 44 was set to the X value (Å).

EXAMPLE 5

The same samples as in Example 1 were prepared by the same method as in Example 1. That is, there were prepared various reproducing head samples having different X values (Å), as shown in Table 5 below, each representing the thickness of each of the first magnetic layer 52 and the third magnetic layer 42.

With respect to these samples, an experiment was conducted to examine the influence of the value of sense current applied to the dual spin-valve magneto-resistive effect multilayer film. Specifically, using the prepared reproducing head samples, (1) Solitary Wave Output (mV/pp) and (2) Pinning Reversal Failure Rate (%) were derived by changing the value of sense current from 3 mA to 4 mA.

The results are shown in Table 5 below and also shown in a graph of FIG. 17 for facilitating understanding visually.

TABLE 5

(sense current 4 mA)

| | Each of t1 and t3 (Å) | Δt = \|t1 − t2\| Δt = \|t3 − t4\| (Å) | Solitary Wave Output (mVpp) | Pinning Reversal Failure Rate (%) |
|---|---|---|---|---|
| 5-1 Sample | 16 | 1 | 1.90 | 7.85 |
| 5-2 Sample | 17 | 2 | 1.98 | 3.10 |
| 5-3 Sample | 18 | 3 | 1.99 | 1.37 |
| 5-4 Sample | 19 | 4 | 1.91 | 0.98 |
| 5-5 Sample | 20 | 5 | 1.80 | 0.95 |
| 5-6 Sample | 21 | 6 | 1.65 | 0.78 |
| 5-7 Sample | 22 | 7 | 1.42 | 0.34 |
| 5-8 Sample | 23 | 8 | 1.08 | 0.42 |

NiCr50/IrMn70/CoFe(X)/Ru8/CoFe15/Cu17/CoFe20/Cu17/CoFe(X)/Ru8/CoFe15/Ta20
t1: Thickness of First Magnetic Layer forming First Fixed Magnetic Layer = X
t2: Thickness of Second Magnetic Layer forming First Fixed Magnetic Layer = 15 Å
t3: Thickness of Third Magnetic Layer forming Second Fixed Magnetic Layer = X
t4: Thickness of Fourth Magnetic Layer forming Second Fixed Magnetic Layer = 15 Å

Figure 17:
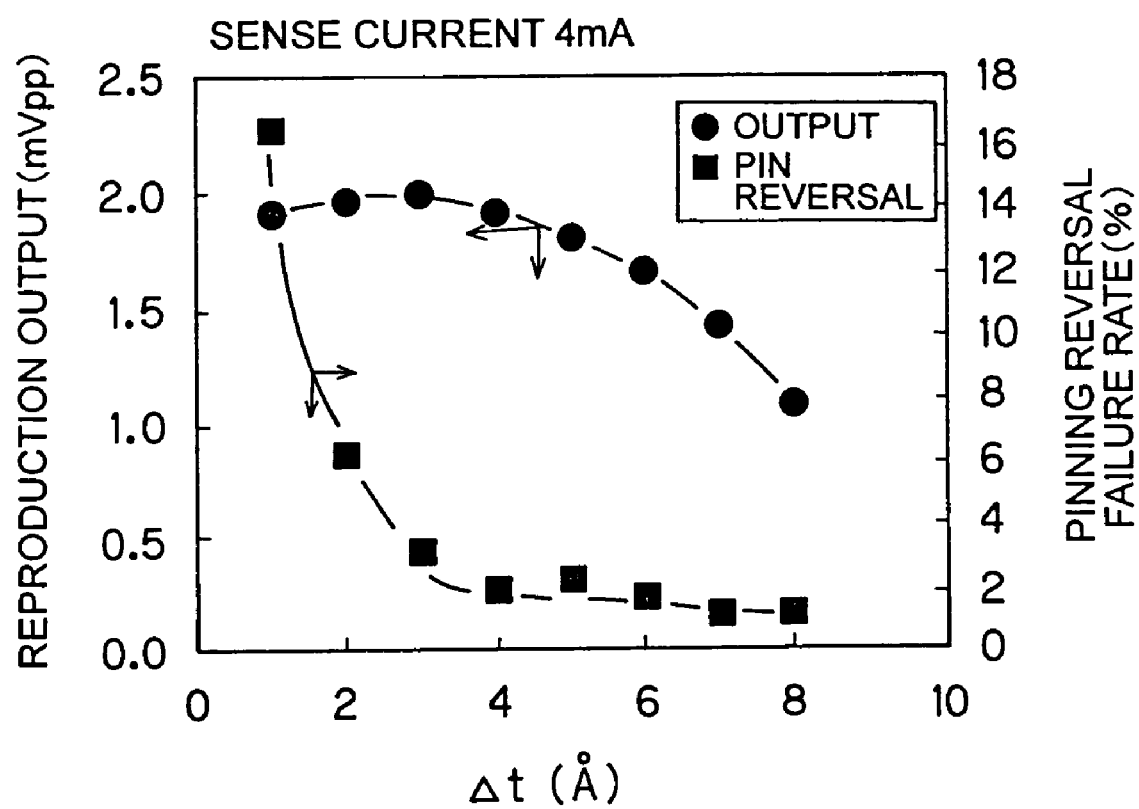
FIG. 17 is a graph showing the results of Table 5.

From the results shown in Table 5 and FIG. 17, it is understood that, given that the thicknesses of the first magnetic layer 52 and the second magnetic layer 54 forming the first fixed magnetic layer 50 are t1 and t2, respectively, and the thicknesses of the third magnetic layer 42 and the fourth magnetic layer 44 forming the second fixed magnetic layer 40 are t3 and t4, respectively, there is observed a tendency of necessity that a value of |t1−t2| representing an absolute value of a difference in film thickness between t1 and t2 be set to 6 Å or less and a value of |t3−t4| representing an absolute value of a difference in film thickness between t3 and t4 be set to 6 Å or less for obtaining high output. It is also understood that, for suppressing the pinning reversal failure rate, there is observed a tendency of necessity to set the value of |t1−t2| to 2 Å or more and the value of |t3−t4| to 2 Å or more.

It was confirmed that these tendencies were the same also in an experiment performed according to the same manner as in Example 2 wherein the thickness of each of the second magnetic layer 54 and the fourth magnetic layer 44 was set to the X value (Å).

EXAMPLE 6

The same samples as in Example 1 were prepared by the same method as in Example 1. That is, there were prepared various reproducing head samples having different X values (Å), as shown in Table 6 below, each representing the thickness of each of the first magnetic layer 52 and the third magnetic layer 42.

With respect to these samples, an experiment was conducted to examine the influence of the value of sense current applied to the dual spin-valve magneto-resistive effect multilayer film. Specifically, using the prepared reproducing head samples, (1) Solitary Wave Output (mV/pp) and (2) Pinning Reversal Failure Rate (%) were derived by changing the value of sense current from 3 mA to 1.5 mA.

The results are shown in Table 6 below and also shown in a graph of FIG. 18 for facilitating understanding visually.

TABLE 6

| | Each of t1 and t3 (Å) | Δt = \|t1 − t2\| Δt = \|t3 − t4\| (Å) | (sense current 1.5 mA) Solitary Wave Output (mVpp) | Pinning Reversal Failure Rate (%) |
|---|---|---|---|---|
| 6-1 Sample | 16 | 1 | 0.74 | 25.75 |
| 6-2 Sample | 17 | 2 | 0.76 | 10.60 |
| 6-3 Sample | 18 | 3 | 0.74 | 5.60 |
| 6-4 Sample | 19 | 4 | 0.72 | 3.20 |
| 6-5 Sample | 20 | 5 | 0.68 | 3.12 |
| 6-6 Sample | 21 | 6 | 0.64 | 2.63 |
| 6-7 Sample | 22 | 7 | 0.56 | 1.58 |
| 6-8 Sample | 23 | 8 | 0.47 | 1.47 |

NiCr50/IrMn70/CoFe(X)/Ru8/CoFe15/Cu17/CoFe20/Cu17/CoFe(X)/Ru8/CoFe15/Ta20
t1: Thickness of First Magnetic Layer forming First Fixed Magnetic Layer = X
t2: Thickness of Second Magnetic Layer forming First Fixed Magnetic Layer = 15 Å
t3: Thickness of Third Magnetic Layer forming Second Fixed Magnetic Layer = X
t4: Thickness of Fourth Magnetic Layer forming Second Fixed Magnetic Layer = 15 Å

Figure 18:
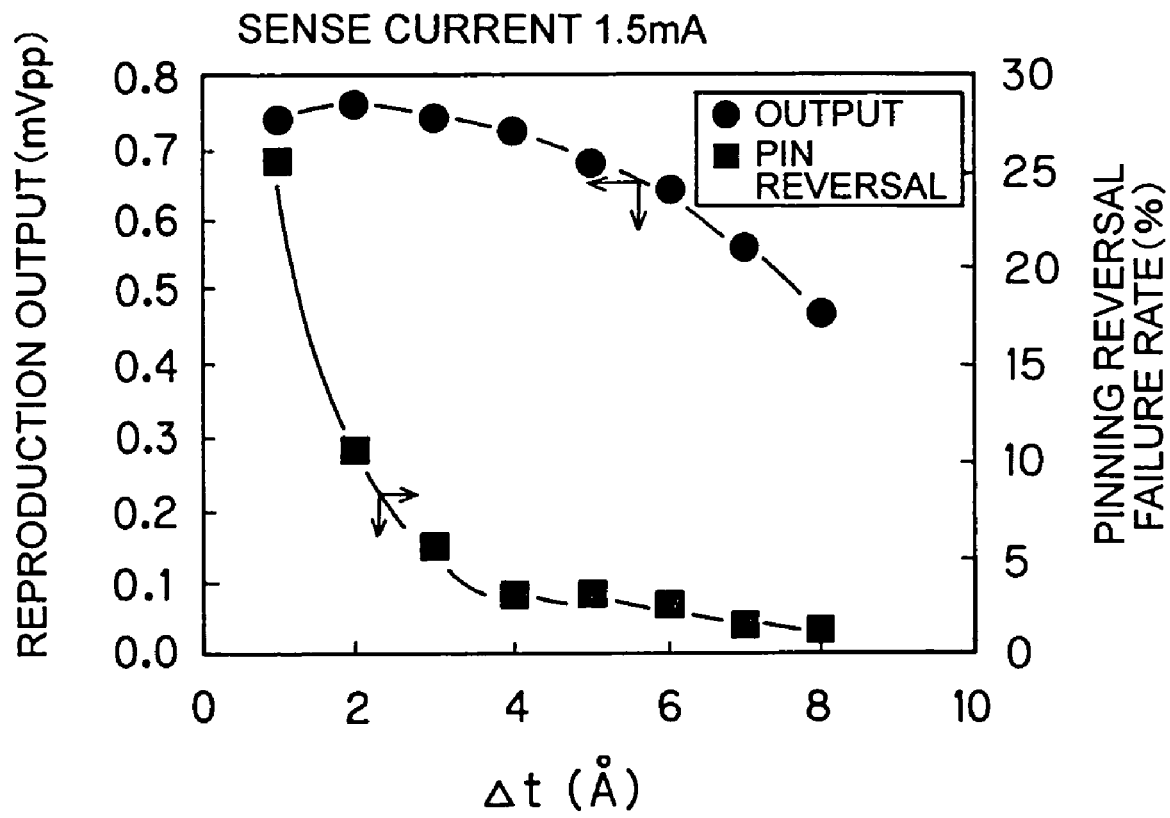
FIG. 18 is a graph showing the results of Table 6.

From the results shown in Table 6 and FIG. 18, it is understood that, given that the thicknesses of the first magnetic layer 52 and the second magnetic layer 54 forming the first fixed magnetic layer 50 are t1 and t2, respectively, and the thicknesses of the third magnetic layer 42 and the fourth magnetic layer 44 forming the second fixed magnetic layer 40 are t3 and t4, respectively, there is observed a tendency of necessity that a value of |t1−t2| representing an absolute value of a difference in film thickness between t1 and t2 be set to 6 Å or less and a value of |t3−t4| representing an absolute value of a difference in film thickness between t3 and t4 be set to 6 Å or less for obtaining high output. It is also understood that, for suppressing the pinning reversal failure rate, there is observed a tendency of necessity to set the value of |t1−t2| to 2 Å or more and the value of |t3−t4| to 2 Å or more.

It was confirmed that these tendencies were the same also in an experiment performed according to the same manner as in Example 2 wherein the thickness of each of the second magnetic layer 54 and the fourth magnetic layer 44 was set to the X value (Å).

EXAMPLE 7

A confirmation experiment was performed in the following manner for examining the influence of a sense current with respect to pinning of a ferromagnetic layer.

Similarly to Example 1, preparation was made of a reproducing head sample having, on a lower shield gap film 4 of $Al_2O_3$, a stacked film composed of an underlayer (NiCr; thickness 50 Å), a soft magnetic layer ($Co_{90}Fe_{10}$; thickness 20 Å), a nonmagnetic layer (Cu; thickness 17 Å), a fixed magnetic layer (($Co_{80}Fe_{20}$; thickness 19 Å)/nonmagnetic intermediate layer (Ru; thickness 8 Å)/($Co_{80}Fe_{20}$; thickness 15 Å)), and a protective layer (Ta; thickness 20 Å).

With respect to this sample, an experiment for confirming the pinning effect by a sense current was conducted by changing the sense current among 1.0 mA, 1.5 mA, 2.0 mA, 2.5 mA, and 3.0 mA.

As a specific confirmation method, a sense current is applied in a normal direction (indicated by positive sign "+") and then applied in an opposite direction (indicated by negative sign "−") while keeping the value of sense current constant, then a judgment is made about each case (e.g. case of +2.0 mA and −2.0 mA) by observing the state of output relative to an external magnetic field.

(1) FIGS. 19(A) and (B) show relationships of an output voltage (axis of ordinates in each graph) with respect to an external magnetic field (axis of abscissas in each graph) when a sense current of +1.0 mA and a sense current of −1.0 mA were applied, respectively. In comparison between both graphs, when the sense current is 1.0 mA, there is no substantial change in output behavior even by changing the current direction. Specifically, there is observed no reversal of a pinning direction following reversal of the current and therefore it is understood that the pinning effect by the current is not exhibited when the sense current is 1.0 mA.

(2) FIGS. 20(A) and (B) show relationships of an output voltage (axis of ordinates in each graph) with respect to an external magnetic field (axis of abscissas in each graph) when a sense current of +1.5 mA and a sense current of −1.5 mA were applied, respectively. In comparison between both graphs, when the sense current is 1.5 mA, there is observed a tendency that output behavior largely changes and reverses by changing the current direction. Specifically, there is observed reversal of a pinning direction following reversal of the current and therefore it is understood that the pinning effect by the current is exhibited when the sense current is 1.5 mA.

Figure 21A:
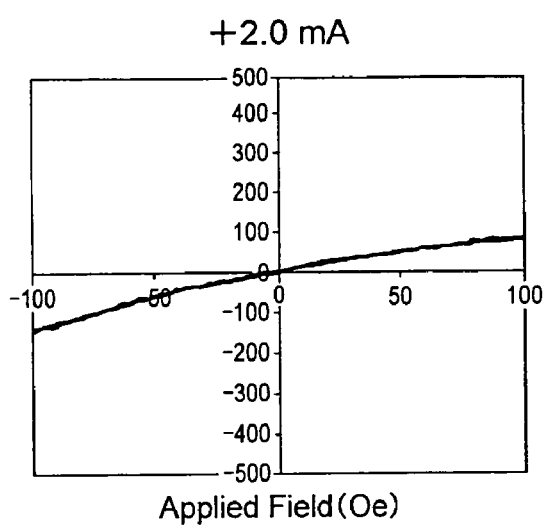
FIGS. 21(A) and (B) are graphs respectively showing relationships of an output voltage (axis of ordinates in each graph) with respect to an external magnetic field (axis of abscissas in each graph) when a sense current of +2.0 mA and a sense current of −2.0 mA were applied, respectively.
Figure 21B:
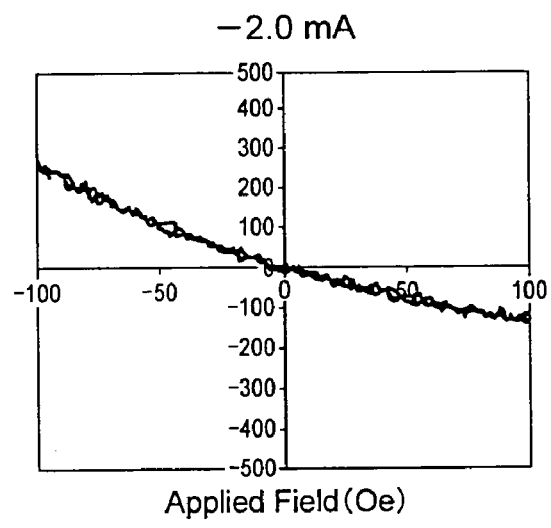

(3) FIGS. 21(A) and (B) show relationships of an output voltage (axis of ordinates in each graph) with respect to an external magnetic field (axis of abscissas in each graph) when a sense current of +2.0 mA and a sense current of −2.0 mA were applied, respectively. In comparison between both graphs, when the sense current is 2.0 mA, there is observed a tendency that output behavior largely changes and reverses by changing the current direction. Specifically, there is observed reversal of a pinning direction following reversal of the current and therefore it is understood that the pinning effect by the current is exhibited when the sense current is 2.0 mA.

(4) FIGS. 22(A) and (B) show relationships of an output voltage (axis of ordinates in each graph) with respect to an external magnetic field (axis of abscissas in each graph) when a sense current of +2.5 mA and a sense current of −2.5 mA were applied, respectively. In comparison between both graphs, when the sense current is 2.5 mA, there is observed a tendency that output behavior largely changes and reverses by changing the current direction. Specifically, there is observed reversal of a pinning direction following reversal of the current and therefore it is understood that the pinning effect by the current is exhibited when the sense current is 2.5 mA.

Figure 23A:
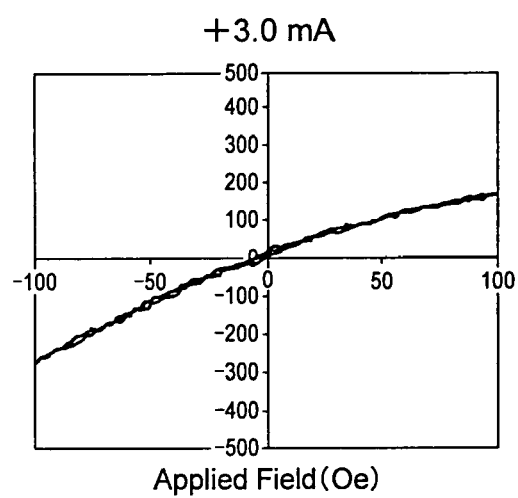
FIGS. 23(A) and (B) are graphs respectively showing relationships of an output voltage (axis of ordinates in each graph) with respect to an external magnetic field (axis of abscissas in each graph) when a sense current of +3.0 mA and a sense current of −3.0 mA were applied, respectively.
Figure 23B:
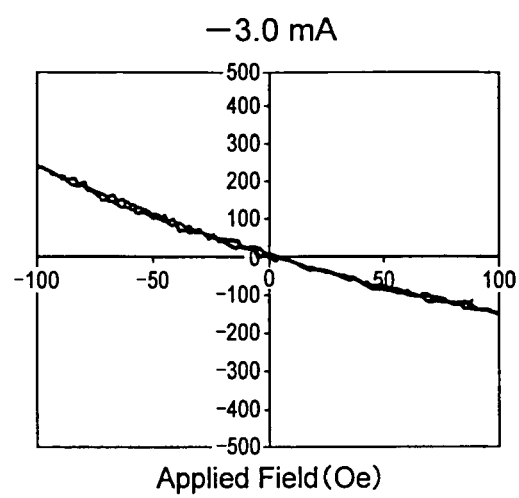

(5) FIGS. 23(A) and (B) show relationships of an output voltage (axis of ordinates in each graph) with respect to an external magnetic field (axis of abscissas in each graph) when a sense current of +3.0 mA and a sense current of −3.0 mA were applied, respectively. In comparison between both graphs, when the sense current is 3.0 mA, there is observed a tendency that output behavior largely changes and reverses by changing the current direction. Specifically, there is observed reversal of a pinning direction following reversal of the current and therefore it is understood that the pinning effect by the current is exhibited when the sense current is 3.0 mA.

As described above in detail, the present invention is a thin film magnetic head including a dual spin-valve magneto-resistive element, wherein the dual spin-valve magneto-resistive element has a dual spin-valve magneto-resistive effect multilayer film composed of a first antiferromagnetic layer, a first fixed magnetic layer being a synthetic ferrimagnetic fixed layer, a first nonmagnetic layer, a soft magnetic layer, a second nonmagnetic layer, and a second fixed magnetic layer being a synthetic ferrimagnetic fixed layer. A stacked film thickness relationship of the first fixed magnetic layer, a stacked film thickness relationship of the second fixed magnetic layer, and a magnetostrictive constant are determined, and it is configured such that a static magnetic field produced from the first fixed magnetic layer and a current magnetic field generated by a sense current act to assist magnetization of the second fixed magnetic layer. Therefore, there is obtained a thin film magnetic head of which the reproduction output is large while gap narrowing and track narrowing are achieved and of which the reliability is high with enhanced stability in pinning fixation.

Particularly, with respect to the stability in pinning fixation, even when there is HDI (Hard Disk Interface) damage due to contact between the thin film magnetic head and a recording medium, or the like during operation of the thin film magnetic head, there is processing stress caused by cutting a wafer into bars each including many thin film magnetic heads and further cutting each bar into the individual magnetic heads, or the like, the pinned direction of the pinned magnetic layer can be maintained in a proper direction without being reversed so that the stability and reliability of the operation are extremely high.

What is claimed is:

1. A thin film magnetic head comprising:
   a dual spin-valve magneto-resistive element,
   wherein said dual spin-valve magneto-resistive element comprises a dual spin-valve magneto-resistive effect multilayer film comprising a first antiferromagnetic layer, a first fixed magnetic layer, a first nonmagnetic layer, a soft magnetic layer, a second nonmagnetic layer, and a second fixed magnetic layer,
   wherein said first fixed magnetic layer is formed as a synthetic ferrimagnetic fixed layer comprising a first magnetic layer contacting with said first antiferromagnetic layer and having a magnetization direction fixed by an exchange coupling magnetic field of said first antiferromagnetic layer, and a second magnetic layer stacked relative to said first magnetic layer via a nonmagnetic intermediate layer,
   wherein said second fixed magnetic layer is formed as a synthetic ferrimagnetic fixed layer comprising a third magnetic layer located on a side of said second nonmagnetic layer, a fourth magnetic layer stacked relative to said third magnetic layer via a nonmagnetic intermediate layer, and the third and fourth magnetic layers are not in direct contact with an antiferromagnetic layer,
   wherein said first magnetic layer and said second magnetic layer forming said first fixed magnetic layer and said third magnetic layer and said fourth magnetic layer forming said second fixed magnetic layer are made of CoFe,
   wherein a static magnetic field produced from a set of end portions of said first fixed magnetic layer acts to assist and fix magnetization of said second fixed magnetic layer, a sense current applied to said dual spin-valve magneto-resistive effect multilayer film, the sense current is parallel to said second fixed magnetic layer, and said sense current generates a current magnetic field that acts to assist and fix the magnetization of said second fixed magnetic layer.

2. The thin film magnetic head according to claim 1, wherein said dual spin-valve magneto-resistive effect multilayer film being arranged in the following order of layers starting from a side of an underlayer: said first antiferromagnetic layer, said first fixed magnetic layer, said first nonmagnetic layer, said soft magnetic layer, said second nonmagnetie layer, and said second fixed magnetic layer.

3. The thin film magnetic head according to claim 1, wherein the sense current has a current value within a range of 1.5 to 4.0 milliamperes.

4. The thin film magnetic head according to claim 1, wherein the first magnetic layer has a thickness of t1, the second magnetic layer has a thickness of t2, the third magnetic layer has a thickness of t3, the fourth magnetic layer has a thickness of t4, and a relationship is established such that t1>t2, then t3>t4.

5. The thin film magnetic head according to claim 4, wherein an absolute value of a difference in film thickness between t1 and t2 is set to 2 to 6 angstroms, and an absolute value of a difference in film thickness between t3 and t4 is set to 2 to 6 angstroms.

6. The thin film magnetic head according to claim 5, wherein said third magnetic layer and said fourth magnetic layer each have a physical property that an absolute value of a magnetostrictive constant thereof is in the range of $1.25 \times 10^{-6}$ to $5 \times 10^{-6}$.

7. The thin film magnetic head according to claim 1, wherein each of said t1, t2, t3, and t4 falls within a range of 5 to 30 angstroms.

8. The thin film magnetic head according to claim 1, wherein each of said t1, t2, t3, and t4 falls within a range of 10 to 18 angstroms.

9. The thin film magnetic head according to claim 1, wherein said first antiferromagnetic layer is made of IrMn.

10. The thin film magnetic head according to claim 1, wherein said dual spin-valve magneto-resistive effect multilayer film has a thickness of 150 to 350 angstroms.

11. A head gimbal assembly comprising:
   a slider including a thin film magnetic head and disposed so as to confront a recording medium; and
   a suspension elastically supporting said slider,
   wherein said thin film magnetic head comprises a dual spin-valve magneto-resistive element,
   wherein said dual spin-valve magneto-resistive element comprises a dual spin-valve magneto-resistive effect multilayer film comprising a first antiferromagnetic layer, a first fixed magnetic layer, a first nonmagnetic layer, a soft magnetic layer, a second nonmagnetic layer, and a second fixed magnetic layer,
   wherein said first fixed magnetic layer is formed as a synthetic ferrimagnetic fixed layer comprising a first magnetic layer contacting with said first antiferromagnetic layer and having a magnetization direction fixed by an exchange coupling magnetic field of said first antiferromagnetic layer, and a second magnetic layer stacked relative to said first magnetic layer via a nonmagnetic intermediate layer,
   wherein said second fixed magnetic layer is formed as a synthetic ferrimagnetic fixed layer comprising a third magnetic layer located on a side of said second nonmagnetic layer, and a fourth magnetic layer stacked relative to said third magnetic layer via a nonmagnetic intermediate layer, and the third and fourth magnetic layers are not in direct contact with an antiferromagnetic layer,
   wherein said first magnetic layer and said second magnetic layer forming said first fixed magnetic layer and said third magnetic layer and said fourth magnetic layer forming said second fixed magnetic layer are made of CoFe,
   wherein a static magnetic field produced from a set of end portions of said first fixed magnetic layer acts to assist and fix magnetization of said second fixed magnetic layer, a sense current applied to said dual spin-valve magneto-resistive effect multilayer film, the sense current is parallel to said second fixed magnetic layer, and said sense current generates a current magnetic field that acts to assist and fix the magnetization of said second fixed magnetic layer.

12. The head gimbal assembly according to claim 11, wherein the sense current has a current value within a range of 1.5 to 4.0 milliamperes.

13. The head gimbal assembly according to claim 12, wherein the first magnetic layer has a thickness of t1, the second magnetic layer has a thickness of t2, the third magnetic layer has a thickness of t3, the fourth magnetic layer has a thickness of t4, and a relationship is established such that t1>t2, then t3>t4.

14. The head gimbal assembly according to claim 13, wherein an absolute value of a difference in film thickness between t1 and t2 is set to 2 to 6 angstroms, and an absolute value of a difference in film thickness between t3 and t4 is set to 2 to 6 angstroms.

15. The head gimbal assembly according to claim 14, wherein said third magnetic layer and said fourth magnetic layer each have a physical property that an absolute value of a magnetostrictive constant thereof is in the range of $1.25 \times 10^{-6}$ to $5 \times 10^{-6}$.

16. A hard disk drive comprising:
a slider including a thin film magnetic head and disposed so as to confront a disc-shaped recording medium driven to be rotated; and
a positioning device supporting said slider and positioning said slider relative to the recording medium,
wherein said thin film magnetic head comprises a dual spin-valve magneto-resistive element,
wherein said dual spin-valve magneto-resistive element comprises a dual spin-valve magneto-resistive effect multilayer film comprising a first antiferromagnetic layer, a first fixed magnetic layer, a first nonmagnetic layer, a soft magnetic layer, a second nonmagnetic layer, and a second fixed magnetic layer,
wherein said first fixed magnetic layer is formed as a synthetic ferrimagnetic fixed layer comprising a first magnetic layer contacting with said first antiferromagnetic layer and having a magnetization direction fixed by an exchange coupling magnetic field of said first antiferromagnetic layer, and a second magnetic layer stacked relative to said first magnetic layer via a nonmagnetic intermediate layer,
wherein said second fixed magnetic layer is formed as a synthetic ferrimagnetic fixed layer comprising a third magnetic layer located on the side of said second nonmagnetic layer, and a fourth magnetic layer stacked relative to said third magnetic layer via a nonmagnetic intermediate layer, and the third and fourth magnetic layers are not in direct contact with an antiferromagnetic layer,
wherein said first magnetic layer and said second magnetic layer forming said first fixed magnetic layer and said third magnetic layer and said fourth magnetic layer forming said second fixed magnetic layer are made of CoFe,
wherein a static magnetic field produced from a set of end portions of said first fixed magnetic layer acts to assist and fix magnetization of said second fixed magnetic layer, a sense current applied to said dual spin-valve magneto-resistive effect multilayer film, the sense current is parallel to said second fixed magnetic layer, and said sense current generates a current magnetic field that acts to assist and fix the magnetization of said second fixed magnetic layer.

17. The hard disk drive according to claim 16, wherein the sense current is within a range of 1.5 to 4.0 milliamperes.

18. The hard disk drive according to claim 17, wherein the first magnetic layer has a thickness of t1, the second magnetic layer has a thickness of t2, the third magnetic layer has a thickness of t3, the fourth magnetic layer has a thickness of t4, and a relationship is established such that t1>t2, then t3>t4.

19. The hard disk drive according to claim 18, wherein an absolute value of a difference in film thickness between t1 and t2 is set to 2 to 6 angstroms, and an absolute value of a difference in film thickness between t3 and t4 is set to 2 to 6 angstroms.

20. The hard disk drive according to claim 19, wherein said third magnetic layer and said fourth magnetic layer each have a physical property that an absolute value of a magnetostrictive constant thereof is in the range of $1.25 \times 10^{-6}$ to $5 \times 10^{-6}$.

* * * * *